(12) United States Patent
Smith et al.

(10) Patent No.: US 8,786,827 B2
(45) Date of Patent: Jul. 22, 2014

(54) METHOD AND APPARATUS FOR MEASUREMENT OF EXIT PUPIL TRANSMITTANCE

(75) Inventors: Adlai H. Smith, Escondido, CA (US); Robert O. Hunter, Jr., Snowmass Village, CO (US)

(73) Assignee: Litel Instruments, San Diego, CA (US)

( * ) Notice: Subject to any disclaimer, the term of this patent is extended or adjusted under 35 U.S.C. 154(b) by 1079 days.

(21) Appl. No.: 12/703,100

(22) Filed: Feb. 9, 2010

(65) Prior Publication Data

US 2011/0007298 A1 Jan. 13, 2011

Related U.S. Application Data

(62) Division of application No. 11/105,799, filed on Apr. 13, 2005, now Pat. No. 7,688,426.

(60) Provisional application No. 60/562,632, filed on Apr. 14, 2004.

(51) Int. Cl.
*G03B 27/72* (2006.01)
*G03B 27/68* (2006.01)
*G03B 27/52* (2006.01)
*G03B 27/62* (2006.01)
*G03B 27/32* (2006.01)
*G03B 27/42* (2006.01)
*G03B 27/54* (2006.01)

(52) U.S. Cl.
USPC ............... 355/71; 355/52; 355/53; 355/55; 355/67; 355/75; 355/77

(58) Field of Classification Search
USPC ............ 355/52, 53, 55, 67–71, 75–77; 250/492.1, 492.2, 492.22, 548; 430/5, 430/8, 22, 30, 311, 312, 321
See application file for complete search history.

(56) References Cited

U.S. PATENT DOCUMENTS 5,136,413 A 8/1992 MacDonald et al.
5,367,358 A * 11/1994 Kamon ........................... 355/71
(Continued)

FOREIGN PATENT DOCUMENTS

JP 2000-021732 1/2000
JP 2001-230179 8/2001
(Continued)

OTHER PUBLICATIONS

Brunner et al, Characterization and Setup Techniques for a 5X Stepper, Optical/Laser Microlithography V, Proc of SPIE vol. 663,1986, p. 106.

(Continued)

*Primary Examiner* — Toan Ton
*Assistant Examiner* — Christina Riddle
(74) *Attorney, Agent, or Firm* — Foley & Lardner LLP

(57) ABSTRACT

A method and apparatus for determining the state of the lens transmittance of an optical projection system are described. A lens or imaging objective transmission is determined as a function of exit pupil transverse direction cosine (nx,ny) at multiple field points thereby providing a more complete analysis and correction of a photolithographic exposure system. The entrance pupil of a projection imaging system is uniformly illuminated and the angular dependence of transmission through the imaging system as a function of exit pupil direction cosines is determined. The illumination source includes a light conditioner with an in-situ illumination structure (ISIS), which is an optical structure that can provide uniform illumination of the system's entrance pupil.

13 Claims, 28 Drawing Sheets

(56) References Cited

U.S. PATENT DOCUMENTS

| | | | |
|---|---|---|---|
| 5,392,119 | A | 2/1995 | McArthur et al. |
| 5,501,925 | A | 3/1996 | Smith et al. |
| 5,640,233 | A | 6/1997 | McArthur et al. |
| 5,644,390 | A * | 7/1997 | Yasuzato ............... 356/121 |
| 5,733,708 | A | 3/1998 | Catanzaro et al. |
| 5,828,455 | A | 10/1998 | Smith et al. |
| 5,929,991 | A | 7/1999 | McArthur et al. |
| 5,978,085 | A | 11/1999 | Smith et al. |
| 6,157,502 | A * | 12/2000 | Kathman ............... 359/819 |
| 6,317,198 | B1 | 11/2001 | Sato et al. |
| 6,356,345 | B1 | 3/2002 | McArthur et al. |
| 6,573,986 | B2 | 6/2003 | Smith et al. |
| 6,701,512 | B2 * | 3/2004 | Sutani et al. ............... 716/53 |
| 2001/0019407 | A1 | 9/2001 | Sato et al. |
| 2001/0030740 | A1 | 10/2001 | Mori et al. |
| 2001/0055103 | A1 * | 12/2001 | Nishi ............... 355/53 |
| 2002/0159040 | A1 * | 10/2002 | Hamatani et al. ............... 355/52 |
| 2002/0159049 | A1 * | 10/2002 | Sato et al. ............... 356/121 |
| 2002/0171815 | A1 * | 11/2002 | Matsuyama et al. ............... 355/55 |
| 2003/0043352 | A1 | 3/2003 | Sudoh et al. |
| 2003/0091913 | A1 | 5/2003 | Shiode |
| 2003/0112421 | A1 | 6/2003 | Smith |
| 2004/0114150 | A1 | 6/2004 | Wegmann et al. |
| 2004/0229133 | A1 | 11/2004 | Socha et al. |
| 2005/0168717 | A1 | 8/2005 | Hinsberg et al. |
| 2005/0185159 | A1 | 8/2005 | Rosenbluth et al. |
| 2009/0290336 | A1 * | 11/2009 | Senzaki et al. ............... 362/231 |

FOREIGN PATENT DOCUMENTS

| | | |
|---|---|---|
| JP | 2002-139406 | 5/2002 |
| JP | 2002-139406-0 | 5/2002 |
| JP | 2002-329653 | 11/2002 |
| JP | 2003-075990 | 3/2003 |
| JP | 2003-255512 | 9/2003 |
| JP | 2004-061515 | 2/2004 |

OTHER PUBLICATIONS de Ruyter et al., Examples of Illumination Source Effects on Imaging Performance, ARCH Chemicals Microlithography Symposium, 2003, pp. 1-8.

Dusa et al, In-house Characterization Technique for Steppers, Optical/Laser Microlithography II, 1989, Proc of SPIE vol. 1088, p. 354.

Flagello et al, Lithographic Lens Testing: Analysis of Measured Aerial Images, Interferometric Data and Photoresist Measurements, Proc of SPIE vol. 2726, p. 788, Jun. 1996.

Goodman, J.W., Statistical Optics, 1st ed. 1985, pp. 374-381.

Hecht, E., Optics, Addison Wesley, 2nd Edition, 1987, pp. 279, 497.

Huang, C., In-situ Optimization of an I-Line Optical Projection Lens, Optical/Laser Microlithography VIII, Proc of SPIE vol. 2440, Feb. 22, 1995, p. 735.

International Search Report and the Written Opinion of the International Searching Authority dated Feb. 28, 2006 for PCT/US2005/012519.

Kirk, J., Astigmatism and Field Curvature from Pin-Bars, Optical/Laser Microlithography IV, Proc of SPIE vol. 1463, p. 282, Mar. 6, 1991.

Lee, W.H., High Efficiency Multiple Beam Gradings, Applied Optics, vol. 18, No. 13, Jul. 1979, pp. 2152-2158.

Patent Abstracts of Japan 8-13, vol. 2002, No. 09, 18-32 Sep. 4, 2002—& JP 2002 139406 A (Nikon Corp), May 17, 2002.

Pfau et al., A Two-Dimensional High-Resolution Stepper Image Monitor, Optical/Laser Microlithography V, Proc of SPIE vol. 1674, Mar. 11, 1992, p. 182.

Raab et al, Analyzing the Deep-UV Lens Aberrations Using Aerial Image and Latent Image Metrologies, Optical Laser Microlithography VII, Proc of SPIE vol. 2197, Mar. 2, 1994.

Reade Advanced Materials Offers: Quartz Crystal Powder, Reade Advanced Materials website, pp. 1-4, at www.reade.com, Feb. 25, 2004.

Sato et al, Impact of Across Pupil Transmittance Variation in Projection Lenses on Fine Device Pattern Imaging, Proc. of SPIE vol. 5040, 2003. pp. 33-44.

Sato et al., Measurement of Transmittance Variation of Projection Lenses Depending on the Light Paths Using a Grating-Pinhole Mask, Proc of SPIE vol. 4346, 2001, pp. 379-386.

Brunner et al., Characterization and Setup Techniques for a 5X Stepper, Optical/Laser Microlithography V, Proc of SPIE vol. 663, 1986, p. 106.

Dusa et al, In-house Characterization Technique for Steppers, Optical/Laser Microlithography II, 1989, Proc. of SPIE vol. 1088, p. 354.

Flagello et al, Lithographic Lens Testing: Analysis of Measured Aerial Images, Interferometric Data and Photoresist Measurements, Proc. of SPIE vol. 2726, p. 788, Jun. 1996.

Kirk, J., Astigmatism and Field Curvature from Pin-Bars. Optical/Laser Microlithography IV, Proc of SPIE vol. 1463, p. 282, Mar. 6, 1991.

Sato et al., Measurement of Transmittance Variation of Projection Lenses Depending on the Light Paths Using a Grating-Pinhole Mask, Proc. of SPIE vol. 4346, 2001, pp. 379-386.

* cited by examiner

31, 16 TERM EXPANSION FOR EXIT PUPIL TRANSMISSION

Exit pupil transmission is represented as a truncated exponential of a Zernike expansion.

T(NX,NY) = exit pupil transmission
= W( NA) * {(NX-N1,NY-N2)| < NA(JUTOFF) * EXP(-SUM{i=1,18}A(i)*Z(N(i),L(i),C(i)) (NX-N1,NY-N2)/NAZRN ) }

Where W( NA) < |(NX-N1,NY-N2)| < NA(CUTOFF)
Where the Zernike coefficients are as ordered in the table below. The Zernike polynomials are peak normalized.

ZERNIKE COEFFICIENT TABLE:

|     | N=1   | N=2   | N=3         | N=4         | N=5   | N=6  |
|-----|-------|-------|-------------|-------------|-------|------|
| L=0 | A(1)  | A(5)/A(6) |         |             |       |      |
| L=1 COS/SIN |  | A(2) | A(7)/A(8) |           | A(9)/A(10) |  |
| L=2 COS/SIN |  |     | A(11)/A(12) | A(15)/A(16) |       |      |
| L=3 COS/SIN |  |     |             | A(13)/A(14) |       |      |

| Mode | Coefficient | N | L | C/S | Zernike polynomials = Z(r,θ,N2) |
|------|-------------|---|---|-----|-------------------------------|
| piston | A(1) | 0 | 0 | 0 | 1 |
| focus | A(2) | 2 | 0 | 0 | -1 + 2r² |
| 3rd order spherical | A(3) | 4 | 0 | 0 | 1 - 6r² + 6r⁴ |
| 5th order spherical | A(4) | 6 | 0 | 0 | -1 + 12r² - 30r⁴ + 20r⁶ |
| x-tilt | A(5) | 1 | 1 | 1 | r * cos(θ) |
| y-tilt | A(6) | 1 | 1 | -1 | r * sin(θ) |
| 3rd order x-coma | A(7) | 3 | 1 | 1 | r * cos(θ) * (-2 + 3 * r²) |
| 3rd order y-coma | A(8) | 3 | 1 | -1 | r * sin(θ) * (-2 + 3 * r²) |
| 5th order x-coma | A(9) | 5 | 1 | 1 | r * cos(θ) * (3 - 12 * r² + 10 * r⁴) |
| 5th order y-coma | A(10) | 5 | 1 | -1 | r * sin(θ) * (3 - 12 * r² + 10 * r⁴) |
| 3rd order 0/90 deg astigmatism | A(11) | 2 | 2 | 1 | r² * cos(2θ) |
| 3rd order 45 deg astigmatism | A(12) | 2 | 2 | -1 | r² * sin(2θ) |
| 5th order 0/90 deg astigmatism | A(13) | 4 | 2 | 1 | r² * cos(2θ) * (-3 + 4 * r²) |
| 5th order 45 deg astigmatism | A(14) | 4 | 2 | -1 | r² * sin(2θ) * (-3 + 4 * r²) |
| x-trifoil | A(15) | 3 | 3 | 1 | r³ * cos(3θ) |
| y-trifoil | A(16) | 3 | 3 | -1 | r³ * sin(3θ) |

Figure 25

METHOD AND APPARATUS FOR MEASUREMENT OF EXIT PUPIL TRANSMITTANCE

REFERENCE TO PRIORITY DOCUMENT

This application is a divisional of U.S. application Ser. No. 11/105,799 filed on Apr. 13, 2004 and claims the benefit of priority of U.S. Provisional Patent Application Ser. No. 60/562,632, entitled "Method and Apparatus for Measurement of Exit Pupil Transmittance", by Adlai Smith, filed Apr. 14, 2004. All of which are hereby incorporated by reference.

BACKGROUND OF THE INVENTION

1. Field of the Invention

The present invention relates generally to characterization of the optical performance of a projection imaging system, in particular, the measurement of the exit pupil transmittance of a projection imaging system.

2. Background

Improving the performance of existing and future steppers can have a large impact on the economics of projection imaging systems, such as those used in the production of microchips and flat panel displays. There has been some development of techniques to improve projection imaging systems through minimally intrusive retrofitting. See McArthur et al., "Plate Correction of Imaging Systems", U.S. Pat. No. 5,392,119, Feb. 21, 1995; McArthur et al., "Plate Correction Technique for Imaging Systems", U.S. Pat. No. 5,640,233, Jan. 26, 1995; McArthur et al., "Single Plate Corrector for Stepper Lens Train", U.S. Pat. No. 5,929,991, Jul. 27, 1999; and Smith et al., "Apparatus Method of Measurement and Method of Data Analysis for Correction of Optical Systems", U.S. Pat. No. 5,978,085, Nov. 2, 1999; MacDonald et al., "Imaging and Illumination System with Aspherization and Aberration Correction by Phase Steps", U.S. Pat. No. 5,136,413, Aug. 4, 1992. Also in-situ interferometer techniques (see A. Smith et al., "Apparatus, Method of Measurement and Method of Data Analysis for Correction of Optical System", U.S. Pat. No. 5,828,455, Oct. 27, 1998, "Apparatus, Method of Measurement and Method of Data Analysis for Correction of Optical System", supra), and source metrology techniques (see McArthur et al., "In-Situ Source Metrology Instrument and Method Use", U.S. Pat. No. 6,356,345, Mar. 12, 2002) have been used to measure projection imaging systems so that they may be improved or adjusted. In addition, recent advances in mask making may be utilized to compensate for transmittance profiles.

In order to adjust a projection imaging system, it is helpful to be able to quickly and reproducibly monitor the state of optical performance of the imaging system. In the above references, distortion and field curvature data from exposed images are inferred, and used to design figured optical surfaces that may be placed between the top lens and the reticle plane of the imaging system. Distortion and field curvature correspond to the lowest order aberrations of an imaging system, namely field dependent tilt and lithographers-focus. Various techniques for in-situ measurement of distortion and field curvature have been developed. See M. Dusa et al., "In-house Characterization Technique for Steppers" *Optical/Laser Microlithography II*, 1989, SPIE Vol. 1088, p. 354; and D. Flagello, B. Geh entitled "Lithographic Lens Testing: Analysis of Measured Aerial Images, Interferometric Data and Photoresist Measurements", SPIE Vol. 2726, p. 788, June 1996.

Techniques for the in-situ measurement of astigmatism have also been developed. See T. Brunner et al., "Characterization and Setup Techniques for a 5×Stepper", *Optical/Laser Microlithography V*, SPIE Vol. 663, 1986, p. 106; and J. Kirk, entitled "Astigmatism and Field Curvature from Pin-Bars", *Optical/Laser Microlithography IV*, SPIE Vol. 1463, p. 282, Mar. 6, 1991.

Techniques for analyzing aerial images and aberrations have also been developed. See A. Pfau et al., "A Two-Dimensional High-Resolution Stepper Image Monitor", *Optical/Laser Microlithography V*, SPIE Vol. 1674, Mar. 11, 1992, p. 182; E. L. Raab et al, "Analyzing the Deep-UV Lens Aberrations Using Aerial Image and Latent Image Metrologies", Optical/Laser Microlithography VII, SPIE Vol. 2197, Mar. 2, 1994, p. 550; and C. Huang, "In-situ Optimization of an I-Line Optical Projection Lens", Optical/Laser Microlithography VIII, SPIE Vol. 2440, Feb. 22, 1995, p. 735.

Use of these, and other, techniques have allowed for rapid, unintrusive characterization of lens aberrations (see U.S. Pat. Nos. 5,828,455 and 5,978,985 both entitled "Apparatus, Method of Measurement and Method of Data Analysis for Correction of Optical System", supra), illumination source (see U.S. Pat. No. 6,356,345 entitled "In-Situ Source Metrology Instrument and Method of Use", supra) and lens distortion (see A. Smith et al., "Method & Apparatus for Self-Referenced Projection Lens Distortion Mapping", U.S. Pat. No. 6,573,986, Jun. 2, 2003).

While these techniques are generally sufficient to characterize much of existing lithographic performance—especially for those lithographic exposure tools that are pushed near and beyond design specifications, both in pitch and resolution, it is also desirable to determine the lens, or imaging objective (IMO) transmission as a function of exit pupil transverse direction cosine (nx,ny)—at multiple field points—to allow for a more complete analysis and correction of the photolithographic exposure system. The output of such measurements would be the exit pupil transmission function $T(nx,ny,xi,yi)$ at discrete points $((xi,yi)i=1:N)$ across the projection image field. Once known, basic details of the IMO such as effective numerical aperture as a function of field position, NA $(xi,yi)$ and asymmetry of the numerical aperture, $\Delta NA (xi,yi)$ may be determined from $T(nx,ny; xi,yi)$. In prior work, a method for determining across pupil transmission variation, (or across field pupil transmittance, APTV) using two-beam interference is discussed. See K. Sato et al., "Measurement of Transmittance Variation of Projection Lenses depending on the Light Paths using a Grating-Pinhole Mask", SPIE Vol. 4346, 2001, pp. 379-386. Using this technique, a source illuminates a phase shift mask and is used to form images in resist patterns. The pitch of the line/space patterns on the phase shift mask is used to sample the transmission across the pupil. Known limitations of this interference method include: sensitivity to source uniformity; mask phase error; source sigma; and resist processing. See "Measurement of Transmittance Variation of Projection Lenses Depending on the Light Paths using a Grating-Pinhole Mask, supra; and K. Sato et al., "Impact of Across Pupil Transmittance Variation in Projection Lenses on Fine Device Pattern Imaging", SPIE, Vol. 5040, 2003, pp. 33-44.

Thus, there is a need for more complete analysis and correction of a photolithographic exposure systems and for improved illumination systems and methods and apparatus to determine lens or imaging objective (IMO) transmission as a function of exit pupil transverse direction cosine (nx,ny) at multiple field points.

SUMMARY

In accordance with embodiments of the invention, techniques are described for determining the exit pupil transmittance of a projection imaging system. A lens or imaging objective (IMO) transmission is determined as a function of exit pupil transverse direction cosine (nx,ny) at multiple field points thereby providing a more complete analysis and correction of a photolithographic exposure system.

The entrance pupil of a projection imaging system is uniformly illuminated and the angular dependence of transmission through the imaging system as a function of exit pupil direction cosines is determined. Techniques for making a light condition that includes an in-situ illumination structure (ISIS), which is an optical structure that can provide uniform illumination of the system's entrance pupil, are described.

An apparatus, method of measurement, and method of data analysis are described for determining the state of the lens transmittance of an optical projection system. The transmission of an imaging objective are taken in-situ and without any significant alteration of the optical or mechanical setup. As such, monitoring and assessing a lens transmission at a plurality of field points can be completed with only brief interruptions of an optical tool's productive time. The techniques described can be used with photolithographic step and repeat reduction or non-reducing imaging systems (steppers), scanning imaging systems, fixed field step and repeat ablation systems, scanning ablation systems, or any other projection imaging or ablation system. Additionally, techniques for correcting transmission error, and improving both lithographic simulation and semiconductor manufacturing are described.

Embodiments of a light conditioner for a projection imaging system that outputs a substantially uniform illumination with an angular extent that is greater than an angular size of an entrance pupil of the projection imaging system are described. The light conditioner includes an optical input and an optical output. The light conditioner receives light at the optical input from a light source and outputs a substantially uniform illumination with an angular extent that is greater than an angular size of an entrance pupil of the projection imaging system. The light conditioner can also include a reticle with a first surface and a second surface. There is at least one lens adjacent to the first surface of the reticle and a coating on the second surface of the reticle with at least one opening in the coating, wherein an opening in the coating corresponds to one of the at least one lens. There is also an aperture plate with at least one opening, wherein an opening in the aperture plate corresponds to one of the at least one opening in the coating. The light conditioner can also include a transmission grating, a phase grating, a phase diffuser, a transmission diffuser, or a polarizing grating.

In another embodiment, the light conditioner includes a reticle with a first surface and a second surface, wherein there is at least one optical opening on the first surface and a corresponding optical opening on the second surface. At least one lens, with a top surface and a bottom surface, is adjacent to the optical opening on the first surface of the reticle. There is also an aperture plate with at least one opening, wherein an opening in the aperture plate corresponds to an optical opening on the second surface, wherein light received at the top of the at least one lens passes through the reticle and is output through the at least one opening in the aperture plate as a substantially uniform illumination with an angular extent that is greater than an angular size of an entrance pupil of the projection imaging system.

The lens top surface can include a transmission grating, a phase grating, a phase diffuser, a transmission diffuser, a bulk diffuser, or a polarizing grating. The lens bottom surface can include a transmission grating, a phase grating, a phase diffuser, a transmission diffuser, a bulk diffuser, or a polarizing grating. The optical opening on the first surface of the reticle can include a transmission grating, a phase grating, a phase diffuser, a transmission diffuser, a bulk diffuser, or a polarizing grating. The optical opening on the second surface of the reticle can include a transmission grating, a phase grating, a phase diffuser, a transmission diffuser, a bulk diffuser, or a polarizing grating.

In yet another embodiment, the light conditioner can include a reticle and a bulk diffuser. The light conditioner also includes an aperture plate with opening, wherein light passing through the reticle and the bulk diffuser is output through the at least one opening in the aperture plate as a substantially uniform illumination with an angular extent that is greater than an angular size of an entrance pupil of the projection imaging system. The bulk diffuser can be located between the reticle and the aperture plate, or adjacent to a reticle surface that is opposite the aperture plate. There can also be a lens adjacent to the reticle.

In another embodiment the light conditioner can include a reticle with a first surface and a second surface, wherein there is at least one optical opening on the first surface and a corresponding optical opening on the second surface. There is at least one first optic adjacent to the first surface of the reticle and a second optic adjacent to the second surface of the reticle, wherein first and second optics are associated and adjacent to the optical openings of the reticle.

There is also an aperture plate with at least one opening, wherein an opening in the aperture plate corresponds to an optical opening on the second surface of the reticle. Light received at the top of the first optic passes through the reticle and the second optic and is output through the at least one opening in the aperture plate as a substantially uniform illumination with an angular extent that is greater than an angular size of an entrance pupil of the projection imaging system. The first optic can include a transmission grating, a phase grating, a phase diffuser, a transmission diffuser, a bulk diffuser, or a polarizing grating. The second optic can include a transmission grating, a phase grating, a phase diffuser, a transmission diffuser, a bulk diffuser, or a polarizing grating.

In still another embodiment, the light conditioner includes a first reflective surface that includes a first optic and a second reflective surface that includes a second optic. There is also an aperture plate with an opening, wherein the opening in the aperture plate is associated with the first and second optics. Light incident upon the first optic reflects onto the second optic, reflects off the second optic and through the opening in the aperture plate as a substantially uniform illumination with an angular extent that is greater than an angular size of an entrance pupil of the projection imaging system. The first optic further comprises a transmission grating, a phase grating, a phase diffuser, a transmission diffuser, a bulk diffuser, or a polarizing grating. The second optic further comprises a transmission grating, a phase grating, a phase diffuser, a transmission diffuser, a bulk diffuser, or a polarizing grating.

An exit pupil transmittance of a projection imaging system may be determined by providing an illumination source with a substantially uniform illumination with an angular extent that is greater than an angular size of an entrance pupil of the projection imaging system. A recording media is exposed with illumination from the illumination source that is emitted from an exit pupil of the projection imaging system. A transmission function of the projection imaging system is reconstructed from the exposed recording media.

The projection imaging system may be a stepper, a scanner, a scanner configured for immersion lithography, or a stepper configured for immersion lithography. The recording media may be a photoresist, an electronic device, or a CCD structure. In addition, the exit pupil numerical aperture of the imaging system may be corrected. The correction may be obtained by adjusting numerical aperture blades. For example, the aperture blades may be adjusted to represent approximately the average numerical aperture of all field points measured. The aperture blades may also be elliptically configured. The correction may include adjusting a position of the numerical aperture. For example, the numerical aperture position may be adjusted to represent an average numerical aperture for all field points measured. A transmission-error of the projection imaging system may also be corrected. For example, the correction may include placement of a gray-level pupil filter into a pupil plane.

Techniques described may also be used to determine a reticle side telecentricity of a projection imaging system. An illumination source with a substantially uniform illumination with an angular extent that is greater than an angular size of an entrance pupil of the projection imaging system can be provided, then exposing a recording media with illumination from the illumination source that is emitted from an exit pupil of the projection imaging system. A transmission function of the projection imaging system as a function of field position from the exposed recording media is reconstructed, then a difference between a center of a reference frame and a center of the exposed exit pupil for each field point is determined and individual components of reticle side telecentricity are calculated. The components can then be fitted to a polynomial function.

The projection imaging system may be a stepper, a scanner, a scanner configured for immersion lithography, or a stepper configured for immersion lithography. Also, the recording media may be a photoresist, an electronic device, or a CCD structure. In addition, exposing the recording media may include multiple sub-exposures.

Techniques described can be used in manufacturing a photolithographic chip mask, or manufacturing of semiconductor chips, or devices. An illumination source can be provided that has a substantially uniform illumination with an angular extent that is greater. than an angular size of an entrance pupil of a projection imaging system, then exposing a recording media with illumination from the illumination source that is emitted from an exit pupil of the projection imaging system. A transmission function of the projection imaging system is reconstructed from the exposed recording media, then adjusting an aperture in the projection imaging system in accordance with the reconstructed transmission profile. After the adjustment a desired mask work reticle may be projected in the projection imaging system. The adjustment may include adjusting the aperture position, or the aperture shape, or an intensity distribution. In addition, exposing the recording media may include multiple sub-exposures.

Techniques described can also be used in controlling a projection imaging system. For example, a controller may be used to adjust the aperture.

Other features and advantages of the present invention should be apparent from the following description of exemplary embodiments, which illustrate, by way of example, aspects of the invention.

BRIEF DESCRIPTION OF THE DRAWINGS

FIG. 25 is a table illustrating a Zernike polynomial expansion of the logarithm of the exit pupil transmittance.

DETAILED DESCRIPTION

Exemplary methods and apparatus for improved illumination systems and for determining lens or imaging objective (IMO) transmission as a function of exit pupil transverse direction cosine (nx,ny) at multiple field points are described. Techniques of determining an in-situ transmission map can be used to determine the exit pupil transmittance thereby allowing a more complete analysis of a projection imaging system, such as a photolithographic exposure system. A more complete analysis of a projection imaging system can be used to improve the performance of the imaging system. For example, the analysis can be used to develop improved corrective optics for use in the imaging system. Techniques described can be applied to steppers and scanners with the added ability to account for variations in source uniformity. Improved analysis of the imaging system using in-situ transmission map techniques generate data that may also be used to help determine opportunities for lens correction as a function of time and improved chip fabrication. In addition, data about the exit pupil transmittance may be utilized in commercially available lithographic modeling programs such as PROLITH™ or Analysis Characterization Engine (ACE)™ for predictive analysis.

Figure 1:
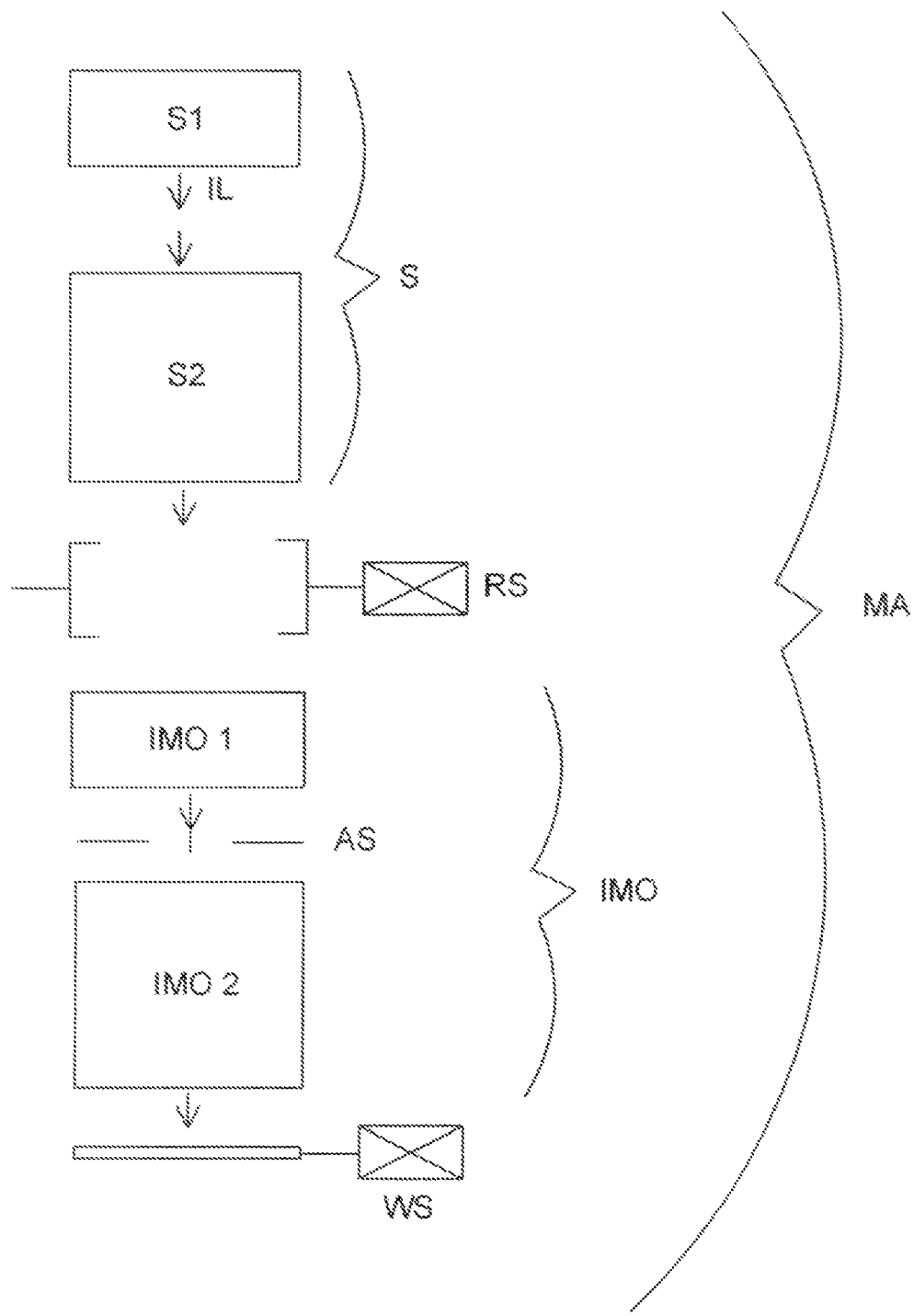
FIG. 1 is a schematic of a lithographic stepper or step and scan machine, that includes lens or imaging objective that can have their transmission as a function of exit pupil transverse direction cosine at multiple field points determined.

FIG. 1, is a schematic of a lithographic stepper or step and scan (scanner) machine, MA, that includes lens or imaging objective (IMO) for which transmission as a function of exit pupil transverse direction cosine at multiple field points can be determined. As shown in FIG. 1, the MA includes a light source S, a reticle stage RS, imaging objective IMO and wafer stage WS. The light source can include an illumination source Si that outputs illumination light IL and an illumination conditioning S2 that conditions the light IL. The IMO includes an upper imaging objective IMO1, a lower imaging objective IMO2, and an aperture stop AS. The illumination light IL is conditioned before entering the AS such that that the angular extent of the illumination source is greater than the angular size of the entrance pupil of the imaging system. This characteristic is also referred to as having a sigma greater than 1 ($\sigma$>1). Various techniques may be used to produce light entering IMO with a sigma greater than 1. For example, as described further below, an in-situ illumination structure (ISIS), or multiple ISIS, can be located in the optical path between the illumination source S1 and the aperture stop, AS, thereby forming a multiple field in-situ illumination structure (MFISIS). Embodiments are described below illustrating the ISIS located at different locations in the optical path. A characteristic of an MFISIS is that it conditions an illumination source so that it has a sigma greater than 1 ($\sigma$>1).

As shown in FIG. 1, the Aperture Stop, AS, limits the maximum angle (numerical aperture or NA) of light ultimately incident at a wafer (not shown) located on the wafer stage, WS. An observer located at (any particular field point) WS and looking back through the lower portion (IM02) of the imaging objective at AS would ideally see a disc with a certain angular subtense (NA=sine of half angle); this is the exit pupil the observer sees. An observer located at the Reticle Stage RS, looking at AS, observes the entrance pupil. If the entrance pupil is uniformly illuminated at a particular field point using an ISIS, and the light intensity coming from the exit pupil, $$\frac{dI}{do}(nx, ny),$$

is observed, then the transmission as a function of angle is, to within a multiplicative constant, equal to:

$$T(nx, ny) = \frac{dI}{do}(nx, ny) * \sqrt{\frac{1 - nx^2 - ny^2}{1 - nx^2/M^2 - ny^2/M^2}} \quad \text{(Equation 1)}$$

Where $$\frac{dI}{do}(nx, ny)$$

is the radiant intensity; power per steradian (or just energy per solid angle), nx and ny represent the transverse direction cosines (on the wafer side) for a particular energy bundle, and M=reduction magnification ratio (4 or 5 typically).

So if an ISIS is used, and $$\frac{dI}{do}(\bar{n}x, \bar{n}y)$$

is measured, or otherwise determined, the angular dependence of the transmission as a function of exit pupil direction cosines can be determined.

First Embodiment, MFISIS

Apparatus for Uniform Illumination of the Entrance Pupil

Figure 2:
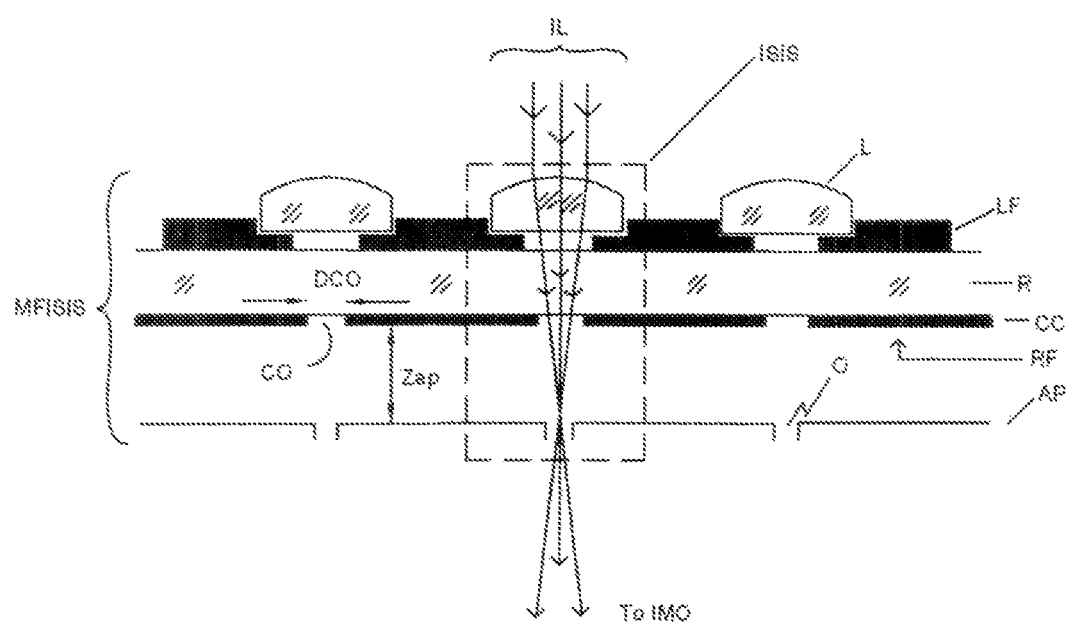
FIG. 2 is a schematic illustrating a portion of a reticle with a multiplicity of lens elements and field, or aperture, openings corresponding to separate and distinguishable field points.

FIG. 2 is a schematic illustrating a portion of a reticle stage with a multiplicity of lens elements L and field, or aperture, openings O corresponding to separate and distinguishable field points. Each lens element L is positioned over the aperture opening O, which is a small hole with a radius R in the aperture plate AP. For any particular field opening on the imaging plane, portions of the source (FIG. 3) are imaged down through both the chrome opening on the backside of the reticle and through a small hole (O) in the aperture plate. Ray bundles leaving the aperture plate spread rapidly and uniformly illuminate the entrance pupil of the optical system. The lens, hole, and aperture are collectively referred to as an in-situ illumination structure, or ISIS one of which is indicated in FIG. 2 by dashed lines. Illumination passing through the ISIS provides uniform illumination of the imaging system's entrance pupil. For any particular field point, the corresponding ISIS structure samples the entire source and superimposes the resulting illumination profiles uniformly over the entrance pupil. The resulting irradiance profile passes through an imaging objective of the imaging system (IMO in FIG. 1) and forms a (field dependent) image of the aperture stop in the plane of the wafer stage (WS in FIG. 1). For each image (field point), measurement of the radiant intensity as a function of the exit pupil direction cosine (for example, an intensity ring in the image) allows for the construction of a transmission function for the exit pupil (see, for example, Equation 11, A. Smith et al., "Apparatus and Method for High Resolution In-Situ Illumination Source Measurement in Projection Imaging Systems", U.S. Publication No. 2005-0237512).

The exemplary multiple field in-situ illumination structure (MFISIS) illustrated in FIG. 2 includes a plurality of in-situ illumination structures (ISIS) packaged in a reticle/pellicle envelope. In the embodiment of FIG. 2, a single ISIS includes a lens, L, with nominal focus at the aperture plate opening, O, and chrome opening, CO, that lets light pass through reticle face, RF. Lens, L, is shown as a plano convex lens but it can take other forms, for example, an aspheric to minimize aberrations that cause lens, L, to focus different incident angles of incident light, IL, at different locations at aperture plate, AP.

As shown in FIG. 2, lens L is supported by lens fixture LF to be adjacent to a first surface of reticle. In the example illustrated in FIG. 2, a lens fixture, LF, holds the lens adjacent to the reticle. For example, the lens may be touching the reticle, or there may be a gap between the bottom of the lens and the reticle. The lens fixture has optical openings that allow light to pass through the lens, lens fixture, reticle and exit through an associated optical opening in a chrome coating on the second, or bottom surface of the reticle. The portions of the lens fixture that do not include optical opens block, or prevent such as reflect or absorb, light thereby preventing the light from passing through the reticle. In another embodiment, the first or top surface of the reticle may be covered with a coating with optical openings and lens may be affixed adjacent to the optical openings.

Figure 3:
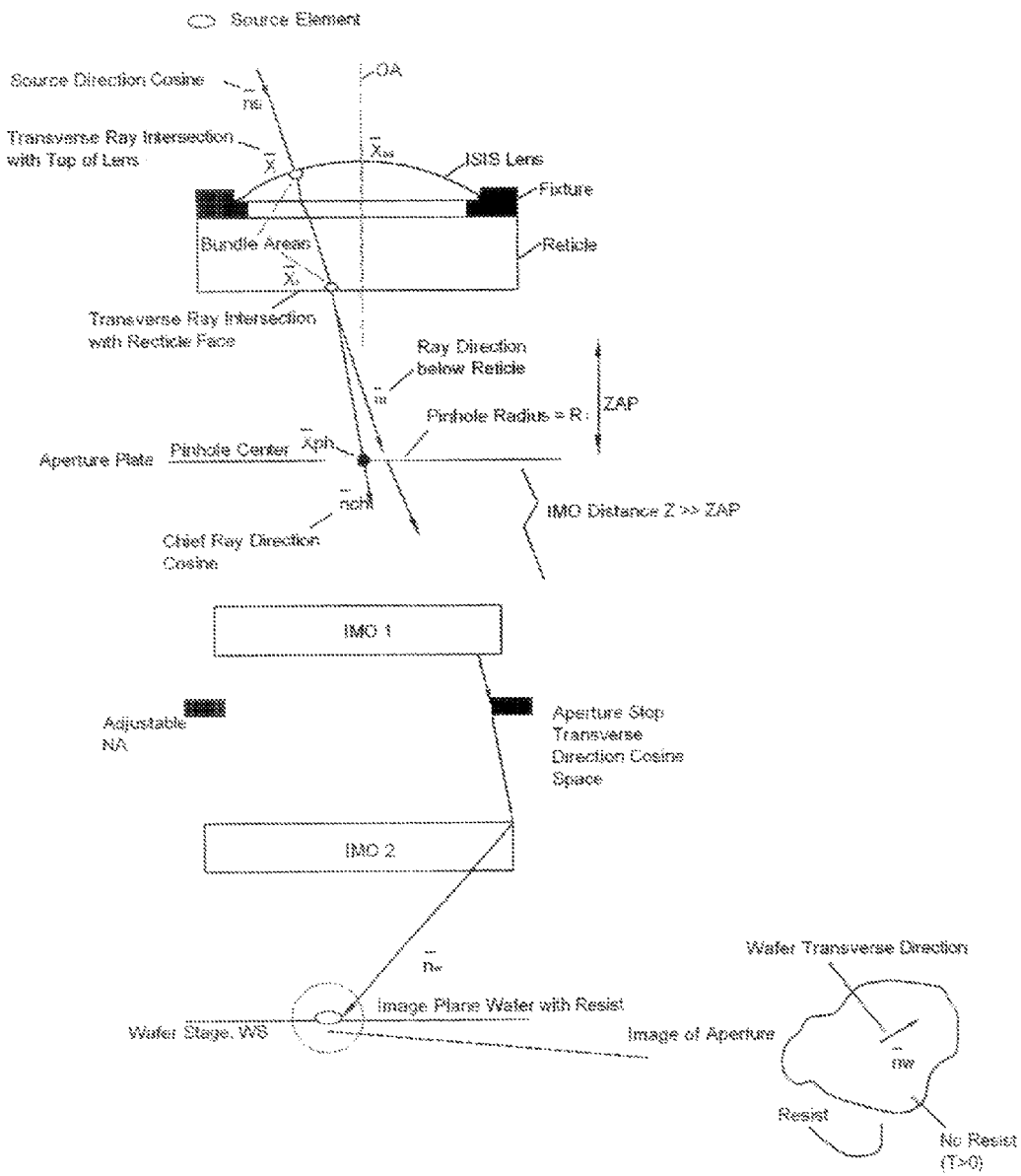
FIG. 3 is a ray trace for an exemplary in-situ illumination structure (ISIS).

FIG. 3 is a ray trace diagram for an exemplary ISIS structure such as illustrated in FIG. 2. Examples of physical requirements (optical elements, hole sizes, positions, and shapes) for each portion of the ISIS structure, as well as exemplary methods of construction for the reticle are described further below.

An exemplary construction of an ISIS using a plano convex lens is:
$\lambda = 248.4$ nm
RL=lens radii of curvature=4.8 mm
LT=lens center thickness=2.1 mm
Reticle thickness=3.81 mm
ZAP=5 mm
DAP=0.06 mm
Reticle/lens material=fused silica.

The intensity at the wafer plane can be shown to be:

$$I_{waf}\left[\frac{1}{M}(\bar{x}_r - \bar{x}_c)\right] = \int \frac{d^2 n_r *}{\sqrt{1-n_w^2}} \frac{dE^{waf}}{do\bar{n}_w}(\bar{n}w) * \quad \text{(Equation 2)}$$

$$Htop(\bar{n}_r - \bar{n}_{ch} < E) * T\left(\frac{M}{n_i}(\bar{n}_r - \bar{n}_{TEL})\right)$$

where:
$I_{waf}$=observed intensity at the wafer plane
M=system reduction magnification
$\bar{x}_r$=transverse (x,y) position where ray strikes reticle face (FIG. 3)
$\bar{x}_{oa}$=optical axis position for a given lens at a given field point
$\bar{x}_c$=nominal field point center=ideal lens transverse position
$\bar{n}_r$=ray transverse direction cosine after leaving reticle face (FIG. 3)
$\bar{n}_w$=ray transverse direction cosine at wafer (FIG. 3)

$$\frac{dE^{waf}}{do_{\bar{n}w}}(\bar{n}w) =$$

radiant intensity at the wafer as a function of the wafer direction cosine

Htop( )=top hat function=(1/0) depending on the inequality expressed within parenthesis (vide infra)
T( )=exit pupil transmission
$\bar{n}_{TEL}$=reticle or entrance pupil machine nontelecentricity
$n_i$=wafer side immersion medium refractive index (=1 for air)
$\bar{n}_{ch}$=pinhole chief ray transverse direction cosine (FIG. 3)
=$(\bar{x}_{ph} - \bar{x}_r)/\sqrt{ZAP^2 + (\bar{x}_{ph}-\bar{x}_r)^2}$
$\bar{x}_{ph}$=transverse location of pinhole center (FIG. 3)
ZAP=aperture plate standoff distance.

For a circular pinhole opening of radius $R_{ph}$, when light is incident with chief ray (FIG. 3) $\bar{n}_{ch} \neq 0$, the effective shape will be an ellipse with major axis perpendicular to $\bar{n}_{ch}$ and semi-major angular size $R_{ph}\sqrt{1-\bar{n}_{ch}^2}/ZAP$ and semi-minor angular size $R_{ph}(1-\bar{n}_{ch}^2)/ZAP$. The center of this ellipse is at $\bar{n}_{ch}$. All rays emanating from point $\bar{x}_r$ (FIG. 3) on the reticle with transverse direction cosines within this ellipse pass through the pinhole. This is what is meant by "$\bar{n}_R - \bar{n}_{ch} < E$".

The wafer transverse direction cosine appearing in Equation 2 is given by the formula (mixed characteristic):

$$\bar{n}_w(\bar{x}_R, \bar{n}_r) = \frac{M}{n_i}\left[\begin{array}{c} A(U,V,W)(\bar{X}_r - \bar{X}_{oa}) + \\ B(U,V,W)(\bar{n}_r + \bar{n}_j) - \bar{n}_{TEL} \end{array}\right] \quad \text{(Equation 3)}$$

where:
$U = \sqrt{(\bar{X}_r - \bar{X}_{oa}) o (\bar{X}_r - \bar{X}_{oa})}$
$V = \sqrt{\bar{n}_r o \bar{n}_r}$
$W = (\bar{X}_r - \bar{X}_{oa}) o \bar{n}_r$
o=2-dimensional vector dot product
$\bar{n}_j$=Grating order; transverse direction cosine
and A, B are functions of the indicated arguments that depend on the ISIS lens (FIG. 3) design and position. A and B can be computed as power series in the indicated arguments.

Now, to the extent that the source $$\frac{dE^{waf}}{do_{\bar{n}w}}$$

in Equation 2 is constant over the range of values (Equation 3), it takes on, we can replace it by a constant in Equation 2. We can approximately move the factor $1/\sqrt{1-n_w^2}$ outside the integral since it varies little over the pinhole opening and then Equation 2 becomes:

$$I_{waf}\left[\frac{1}{M}(\bar{x}_r - \bar{x}_c)\right] \sim \frac{1}{\sqrt{1-\bar{n}_{w,c}^2}} \langle T \rangle \left(\frac{M}{n_i}(\bar{n}_r - \bar{n}_{TEL})\right) \quad \text{(Equation 4)}$$

where;
$\bar{n}_{w,c} = \bar{n}_w(\bar{X}_r, \bar{n}_{ch})$ in Equation 3
<T>=transmission convolved with pinhole
This is equivalent to Equation 1 if we express $I_{waf}$ in terms of the radiant intensity per solid angle $$\left(\frac{dI}{do}\right)$$

reaching the wafer.

Second Embodiment, MFISIS

Figure 4:
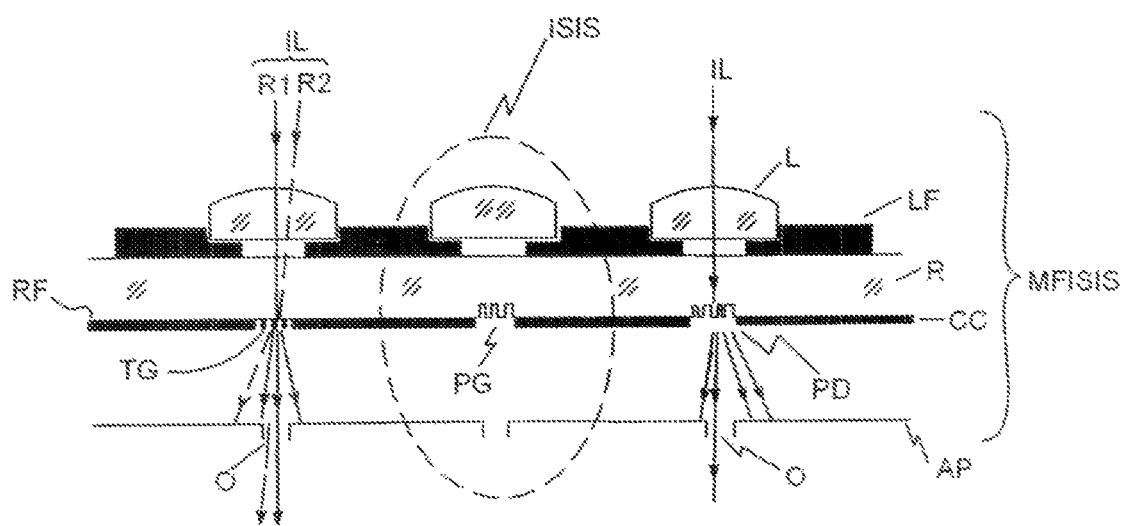
FIG. 4 is a schematic of another embodiment of ISIS.

FIG. 4 is a schematic showing another embodiment of ISIS. Illustrated in FIG. 4 are three different variations of ISIS. This embodiment is similar to the first embodiment with the exception that structures on reticle face, RF, replace the clear, unobstructed and unmodulated chrome openings, CO. The first variation on the left shows incident light ray R1 striking transmission grating, TG, and being split into multiple orders, some of which pass through opening, O, others intercepted by AP. Ray R2 at a different incident angle than R1 also strikes, TG, is diffracted into multiple orders, some of which pass through O. A benefit of TG is to ameliorate the effect of somewhat inhomogeneous illumination sources (non-uniform intensity) and thereby allow a larger opening, O, to be utilized. Larger O means less exposure time required for characterizing machine MA. Equation 2 can be modified to account for rays scattered by the transmission grating by summing the power for each diffracted order separately.

$$\frac{1}{\sqrt{1-n_w^2}} \frac{dE^{waf}}{do_{nw}}(\bar{n}_w) \text{ is replaced by}$$

In Equation 2

$$\sum_j \frac{F_j}{\sqrt{1-n_{w,j}^2}} \frac{dE^{waf}}{do_{nw}}(\bar{n}_{w,j})$$

where:
$F_j$=fraction of power scattered from $\bar{n} \rightarrow \bar{n}+\bar{n}_j$ by grating
$\bar{n}_j$=grating order or scattering transverse direction cosine.
$\bar{n}_{w,j}=\bar{n}_w(\bar{x}_r,\bar{n}_r+\bar{n}_j)$ in Equation 3

Figure 5:
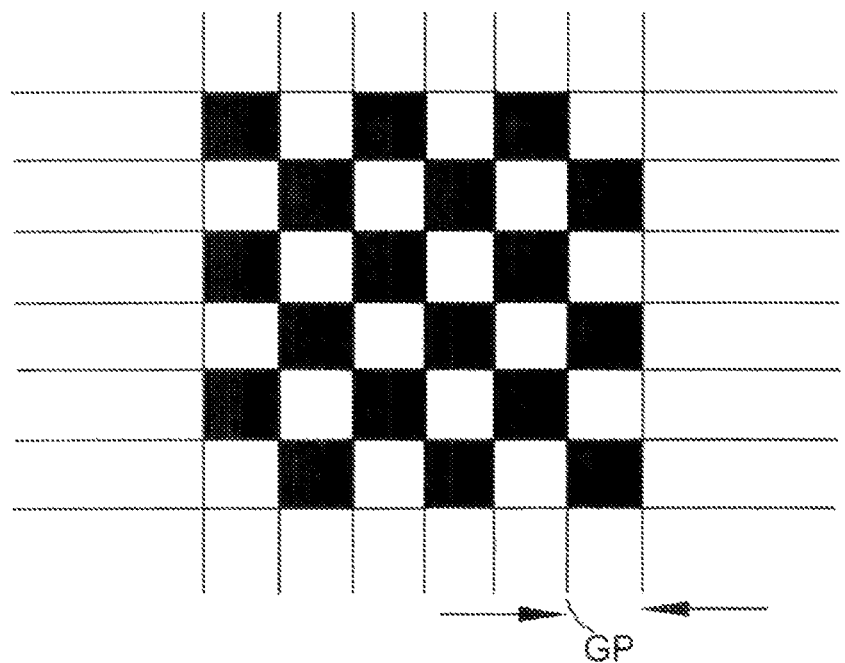
FIG. 5 is a diagram illustrating an exemplary checkerboard transmission grating of period GP.

FIG. 5 is a diagram illustrating an exemplary checkerboard transmission grating of period GP. If a source or class of sources consist of 'lumps' at angular spacing $\Delta\theta$ (on reticle side), then picking GP from amongst:

$$\frac{\lambda}{GP} = \frac{\Delta\theta}{2}, \frac{3}{2}\Delta\theta, \frac{5}{2}\Delta\theta, ...$$

will minimize source inhomogeneity.

So that the TG does not print through (appear as a modulated light and dark pattern at the wafer) we need $$GP < \frac{2*\lambda}{D_{ap}/Z_{ap}} \quad \text{(Equation 5)}$$

Figure 6:
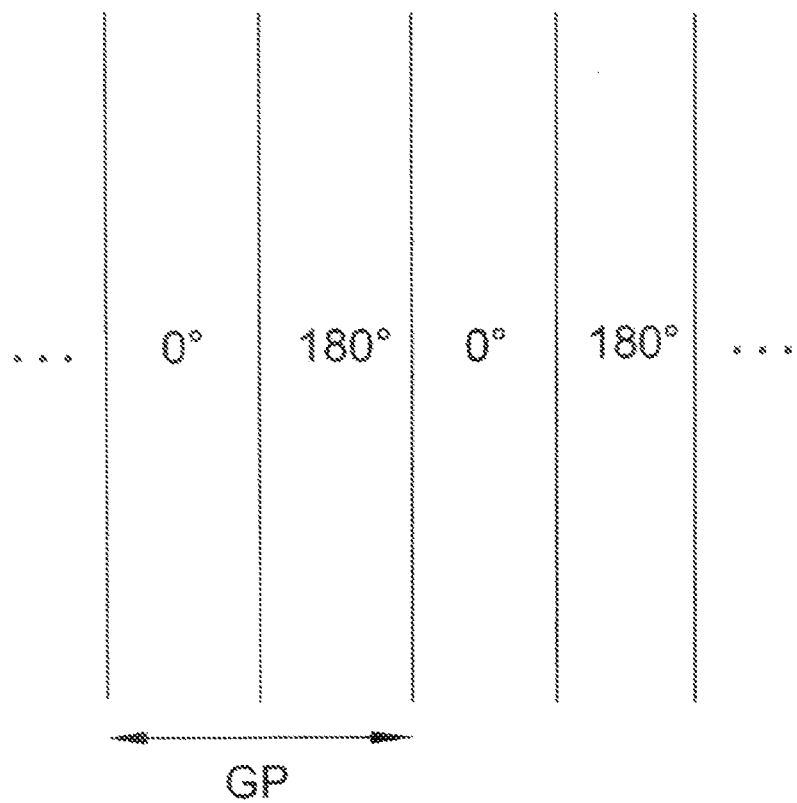
FIG. 6 is a diagram illustrating a simple two-level (0° and 180°) grating.

The middle ISIS of FIG. 4 is a second variation. Instead of a TG, a phase grating (PG) is used. PGs generally have higher diffraction efficiencies and good designs that spread out energy evenly in low orders exist (see WH. Lee, "High Efficiency Multiple Beam Gradings", *Applied Optics*, Vol. 18, No. 13, July 1979, pp. 2152-2158). FIG. 6 is a diagram illustrating a simple two-level (0° and 180°) grating. An advantage of using a phase grating (two or more phase levels) is grating period constraint of Equation 5 need not apply (print through is not an issue).

Figure 7:
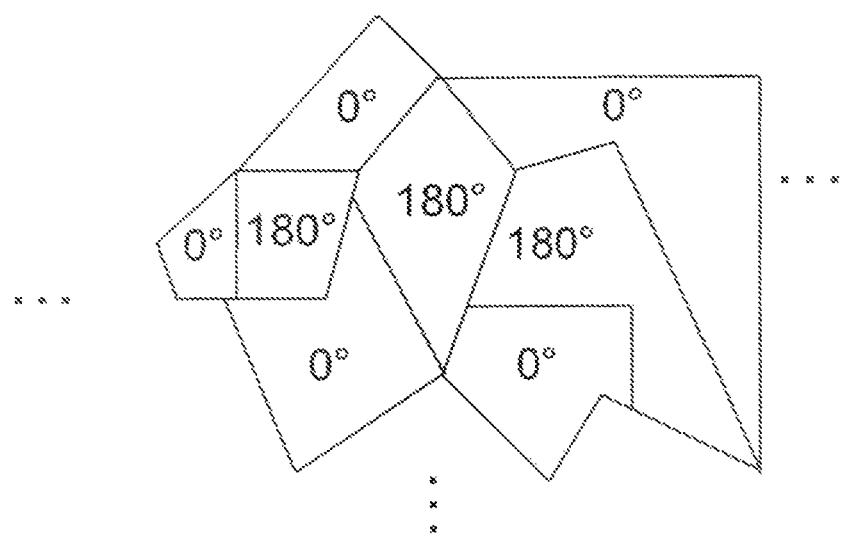
FIG. 7 is a diagram illustrating a portion of a two-level (0° and 180°) phase diffuser (PD) as might be fabricated using standard mask making lithography.

The ISIS on the right side of FIG. 4 uses a phase diffuser (PD) to break up the incident light into a large (infinite) number of orders. This provides for maximum homogenization of incident light, IL. FIG. 7 is a diagram illustrating a portion of a two-level (0° and 180°) PD as might be fabricated using standard mask making lithography.

Figure 8:
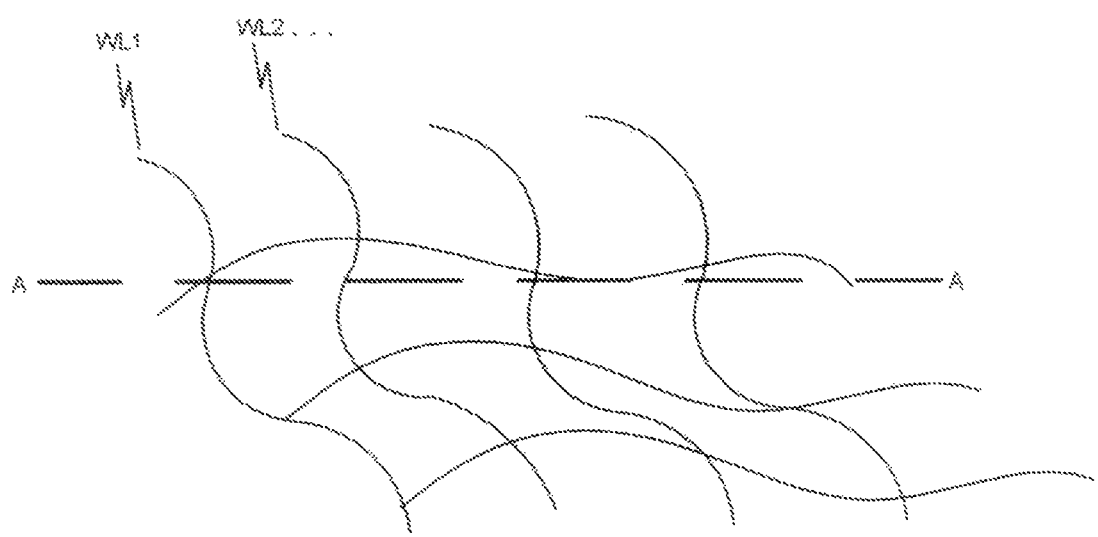
FIG. 8 is a diagram illustrating another exemplary phase diffuser, in this instance consisting of a multiplicity (>2) of phase levels.
Figure 9:
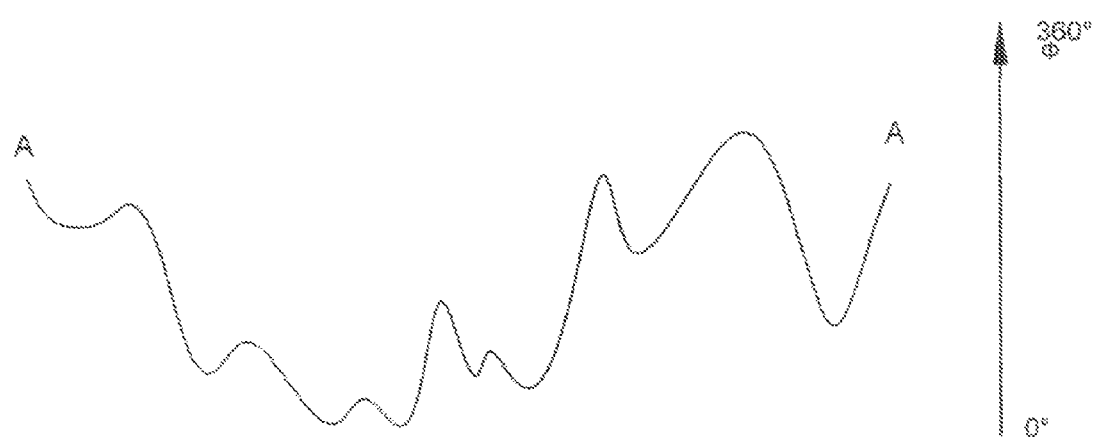
FIG. 9 is a diagram of cross section AA in FIG. 8 as a phase $\Phi$ variation.

FIG. 8 is a diagram illustrating another exemplary phase diffuser, in this instance consisting of a multiplicity (>2) of phase levels. Being difficult to represent in a drawing, it is represented by the wavy lines WL1, WL2, etc. Cross section AA in FIG. 8 is shown in FIG. 9 as a phase Φ variation. This variation will generally be different for different sections of the phase diffuser. The scattering properties of the phase diffuser are statistically represented by the auto-correlation function (R) of the phase Φ as:

$$\langle \Phi(\bar{x})\Phi(\bar{y}) \rangle = R(\bar{x}-\bar{y}) \quad \text{(Equation 6)}$$

where:
$\bar{x},\bar{y}$=transverse position
$\langle\,\rangle$=ensemble or statistical average Equation 6 applies to phase diffusers that are translationally invariant, e.g., phase diffusers whose average scattering distribution over small spatial patches is the same at different locations on the diffuser face. Given R, we can compute the angular distribution of scattered light by standard means ("Statistical Optics", J. W. Goodman, 1st ed, Pages 374-381). Though shown in FIG. 9 as a continuous phase, it could also be a number of discrete phase levels depending on the method of manufacture (see Catanzaro et al., "Multilayer E-Beam Lithography on Nonconducting Substrates", U.S. Pat. No. 5,733,708, Mar. 31, 1998).

Figure 10:
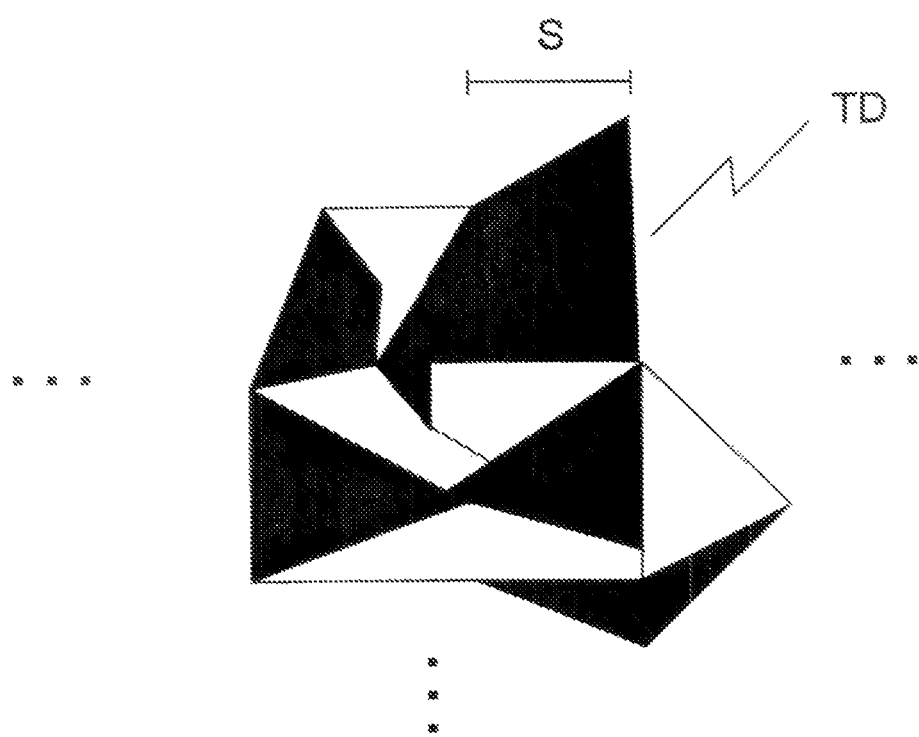
FIG. 10 is a diagram illustrating an exemplary transmission diffuser (TD).

A fourth variation, not shown, utilizes a transmission diffuser (TD), in place of TG in the first variation illustrated in FIG. 4. FIG. 10 is a diagram illustrating an exemplary. TD. To prevent print through, the characteristic size S for each sub-feature needs to satisfy:

$$S < \frac{\lambda}{D_{ap}Z_{ap}} \quad \text{(Equation 7)}$$

MFISIS, Third Embodiment

Figure 11:
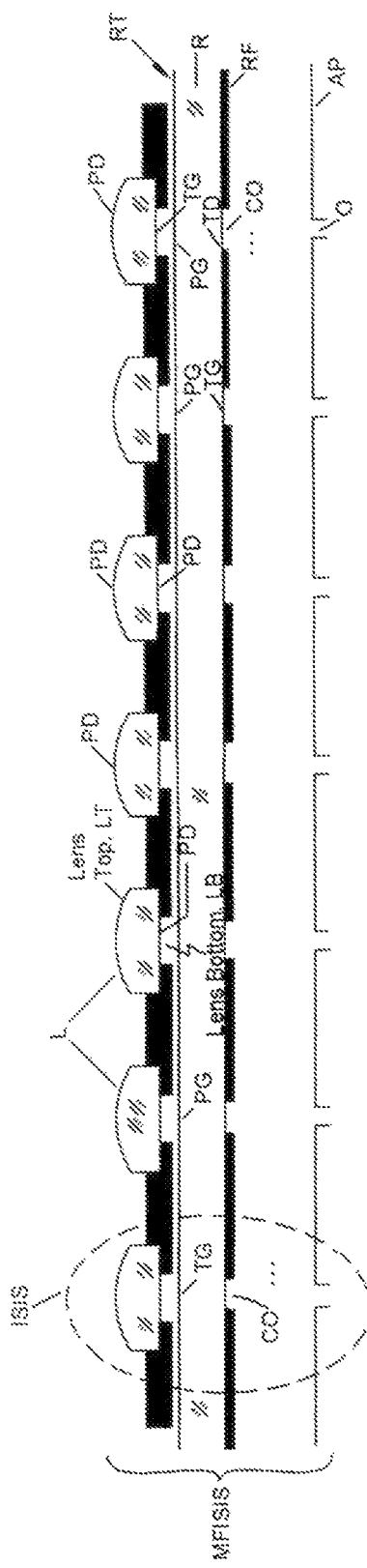
FIG. 11 is a schematic diagram illustrating seven different variations of an ISIS.

FIG. 11 is a schematic diagram illustrating seven different variations of an ISIS. This is similar to the first embodiment, illustrated in FIG. 2, regarding lens, L, only now we distribute the four basic scattering structures described in the second embodiment (TG, PG, PD, TD) on some or all of the four surfaces: reticle face (RF), reticle top (RT), lens bottom (LB), or lens top (LT). There are $4^4$=256 possible variations; four of which were covered in the second embodiment, leaving 252 new variations of which only seven are shown. The advantage of placing scattering structures TG, PG, PD, TD on surfaces other than the RF is that the possibility of print through (restriction of Equations 5 and 7) is reduced, or removed.

Fourth Embodiment, MFISIS

Figure 12:
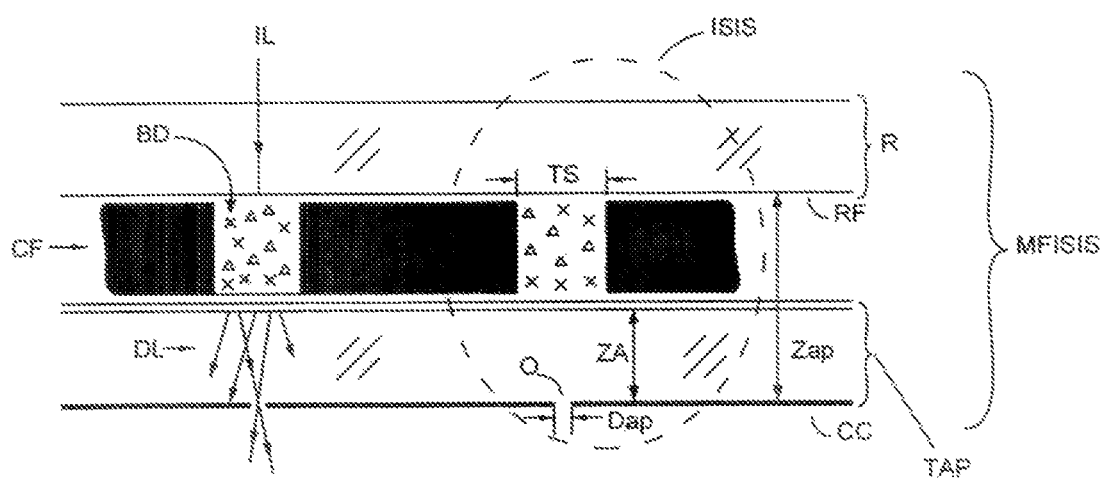
FIG. 12 is a schematic illustrating an embodiment of an multi-field in-situ illumination structure (MFISIS) where the ISIS consists of a bulk diffuser.

FIG. 12 is a schematic illustrating an embodiment of an MFISIS where the ISIS consists of a bulk diffuser BD held transversely in place by a containment fixture CF capped on the top by reticle R, and at the bottom by transparent aperture plate TAP. In the example illustrated, the TAP is transparent except for chrome coating, CC, that contains openings, O. Incident light, IL, strikes BD and because of the random size, shape, orientation and local packing fraction of the individual particles making up the BD, it performs a sort of optical random walk that not only changes the incident direction but also creates numerous additional light rays that emerge from BD as diffused light, DL.

The bulk diffuser may be made of different types of material. For example, quartz crystal powder (see "Reade Advanced Materials Offers: Quartz Crystal Powder, Reade Advanced Materials website, pp. 1-4, 2004) or simply ground up, UV grade synthetic fused silica with scale, or size, ss satisfying:

$$ss<0.03(Z_{ap}-Z_A)=0.03*\text{containment fixture height} \quad \text{(Equation 8)}$$

is readily obtained as bulk diffuser, BD. At longer wavelengths, ordinary ground glass could be used.

To insure illumination of the entrance pupil, there is also the constraint:

$$N * \frac{TS/3}{ZA} / \frac{NA}{M} \quad \text{(Equation 9)}$$

where:
N=Refractive index of TAP
TS=transverse size of individual containment cells
ZA=TAP thickness
NA=numerical aperture of exit pupil
M=machine reduction magnification (4 or 5 typically)

Figure 13:
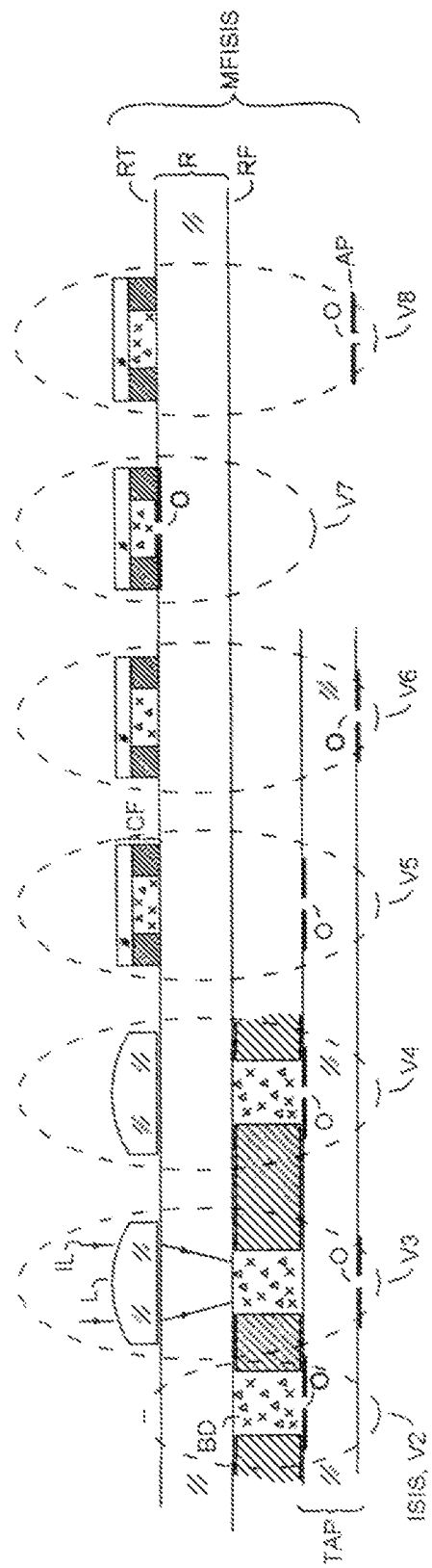
FIG. 13 is a schematic diagram illustrating seven additional variations of ISIS.

FIG. 13 is a schematic diagram illustrating seven additional variations of ISIS labeled from left to right as V2:V8. The variations V2:V8 all utilize transparent aperture plate, TAP, which contains the defining opening, O. In variation V2, opening, O, is located on the top side of TAP, next to BD. Variation V3 is identical to the arrangement of FIG. 12 except lens, L, is used to concentrate additional light on BD. The bulk diffuser (BD) or a discrete diffuser may be in contact or close proximity to an optical opening on reticle. Variation V4 is the same as V2 only additional lens, L, concentrates light on BD. Variation V5 consists of BD within CF on the reticle top, RT, and covered by transparent cover plate, TCP. Opening, O, is located on the top side of the TAP. Variation V6 is like V5 only opening is located on TAP bottom. Variation V7 consists of bulk diffuser held in place on the reticle top, RT, by containment fixture and transparent cover plate but opening, O, is now located at reticle top, RT. Variation V8 is like variation V6 only now instead of TAP containing opening, O, metal aperture plate, AP, contains openings, O.

Fifth Embodiment of MFISIS

Figure 14:
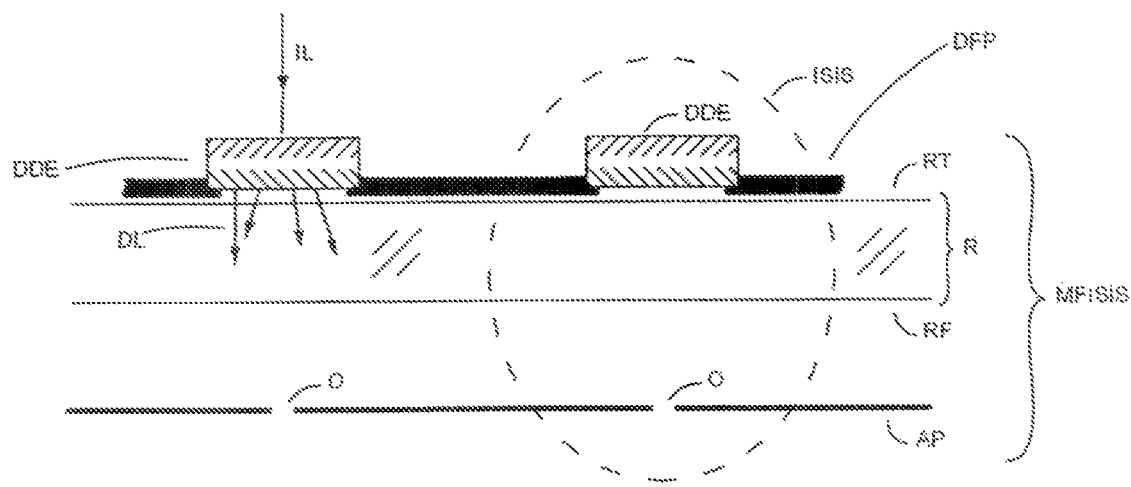
FIG. 14 is a schematic diagram illustrating a fifth embodiment of a MFISIS.

FIG. 14 is a schematic diagram illustrating a fifth embodiment of a MFISIS. In this embodiment the MFISIS includes an ISIS made up of discrete diffuser elements, DDE, attached to diffuser fixture plate, DFP, which is attached to the reticle top, RT. The aperture plate, AP, stands off from the reticle face, RF, and contains openings, O. The action of DDE is shown on the left ISIS of FIG. 14 where incident light, IL, is broken up into multiple rays moving in diverse directions, DL. Discrete diffusion elements can be of various forms (see A. Smith et al., "High Power Masks & Methods for Manufacturing Same", U.S. Pat. No. 5,501,925, Mar. 26, 1996, granular chemical etching, etc.).

Sixth Embodiment of MFISIS

Figure 15:
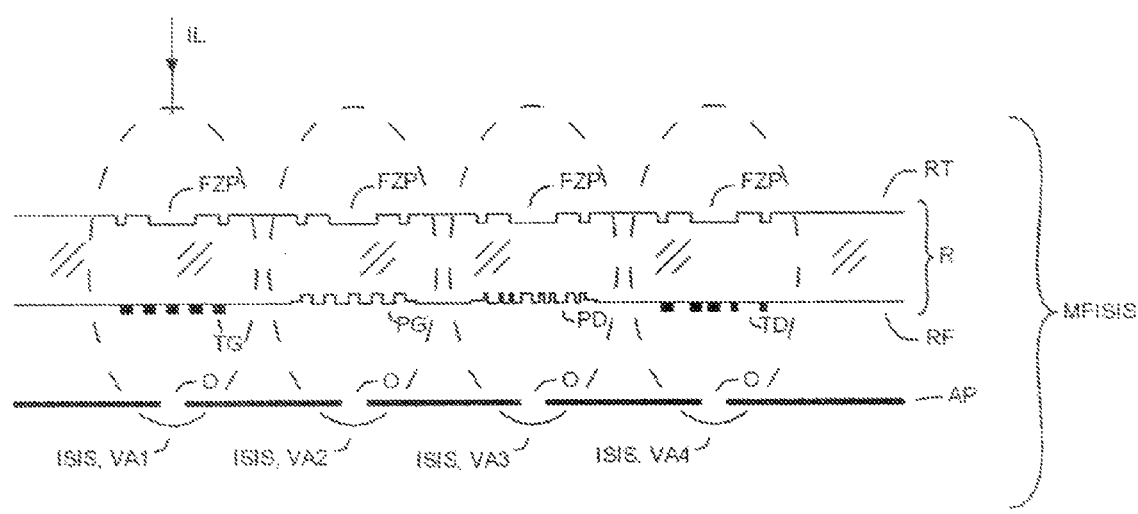
FIG. 15 is a schematic diagram illustrating a sixth embodiment of a MFISIS.

FIG. 15 is a schematic diagram illustrating a sixth embodiment of a MFISIS. In this embodiment, the MFISIS includes four separate variations of the ISIS (VA1:VA4) depicted. This embodiment is very similar to the second embodiment, illustrated in FIG. 4, but instead of a lens, L, focusing on an opening, O, in an aperture plate, AP, it has been replaced with a Fresnel zone plate, FZP, that is integral to the reticle top, RT, that focuses on an opening, O. The Fresnel zone plate can be designed to optimally focus on opening, O, with zero spherical aberration. By making multi-level structures, it can also have high efficiency. The four variations show TG, PG, PD and TD applied to the reticle face, RF. Advantages and design considerations are discussed under the second embodiment. An additional embodiment (not shown) consists of an FZP focused on aperture plate opening, O, but clear glass (no TG, PG, PD or TD) on reticle face, RF.

Seventh Embodiment of MFISIS

Figure 16:
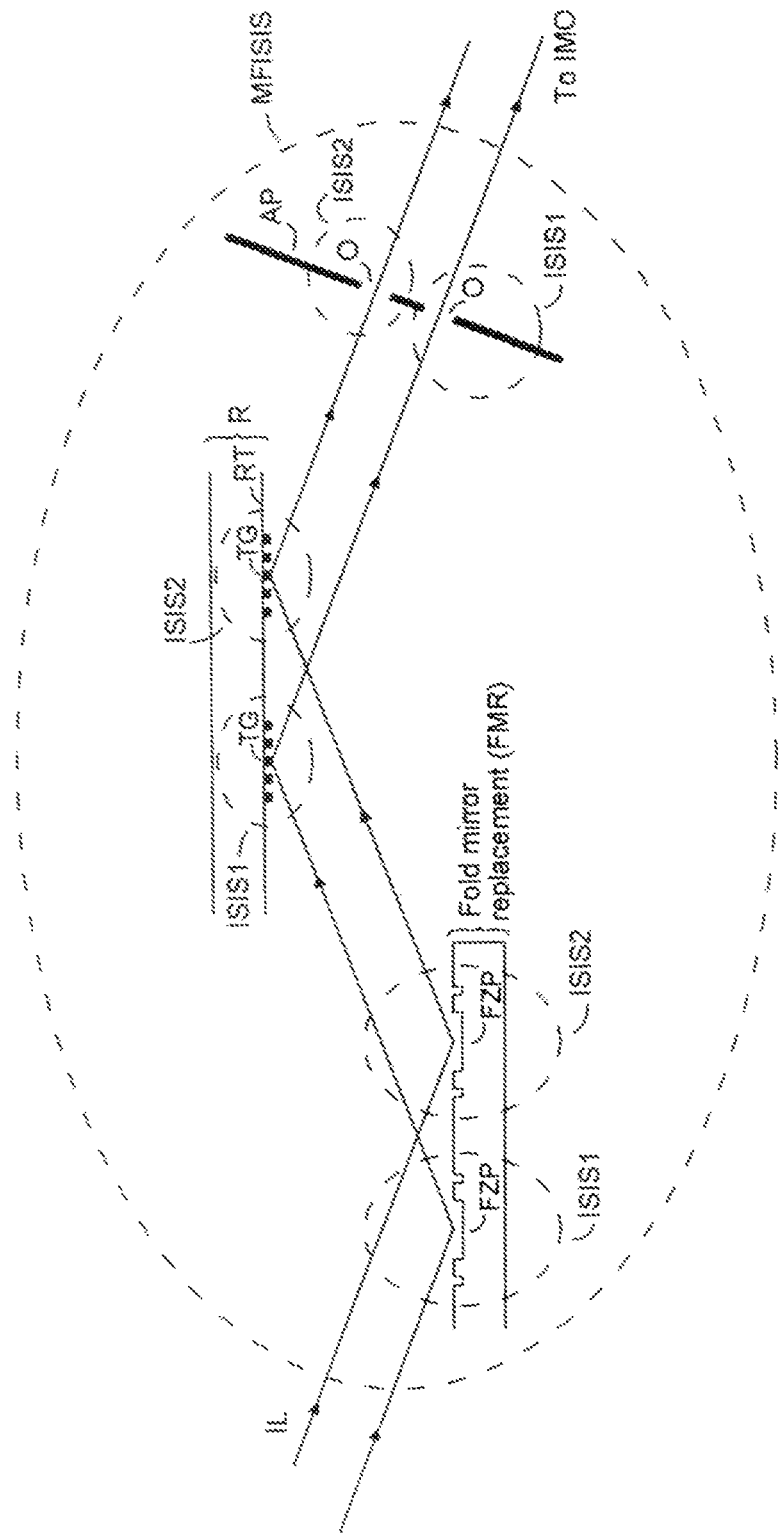
FIG. 16 is a schematic diagram illustrating a seventh embodiment of a MFISIS.

FIG. 16 is a schematic diagram illustrating a seventh embodiment of a MFISIS. In this embodiment, the MFISIS is for use in a reflective system. Incident light, IL, strikes fold mirror replacement, FMR, that consists of a multiplicity of Fresnel zone plates, FZP; each FZP focusing on a separate opening, O, in aperture plate, AP. After striking FMR, light is incident on reticle, R, which contains separate transmission grating elements, TG, for each ISIS. The function of TG is as in the first embodiment, to further homogenize the incident light source. Finally, aperture plate, AP, containing openings, O, is placed in the beam path. This MFISIS consists of three physically discrete and separated elements, FMR, R, and AP.

Eighth Embodiment of MFISIS

To assist in understanding the following discussion it may be helpful to briefly review FIG. 1. FIG. 1 is a schematic of a lithographic projection machine, MA (stepper or scanner). The Light source, S, is broken into two portions Si and S2. Si may include the primary light source (laser or lamp) and some beam forming optics while S2 may include the balance of beam forming optics. Next, the reticle stage, RS, holds and moves the reticle, R, (not shown). Next is the imaging objective, IMO, that consists of pre-aperture stop optics, IMO1, the physical aperture stop, AS, and post-aperture stop optics 1M02. Finally, the wafer stage, WS, holds the wafer (not shown) for photo exposure.

Figure 17:
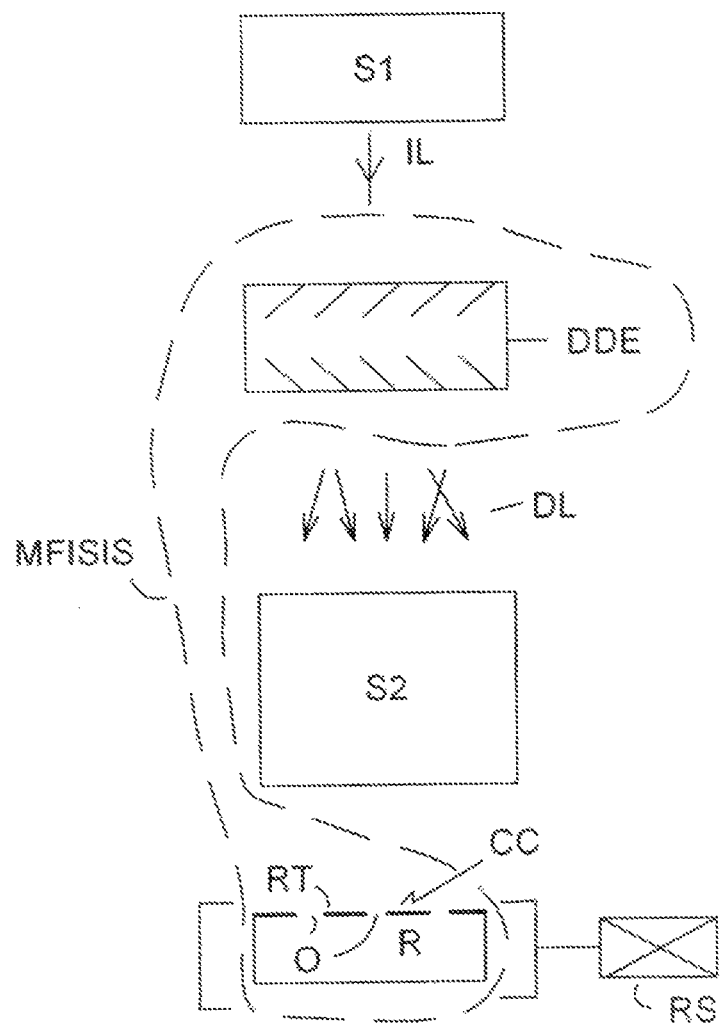
FIG. 17 is a block diagram illustrating an embodiment of a MFSIS.

FIG. 17 is a block diagram illustrating an embodiment of a MFSIS. As shown in FIG. 16, on this embodiment, first variation, a MFISIS includes a discrete diffuser DDE placed between sections SI and S2 of the source optics and a reticle, R, containing transparent openings, 0, in otherwise chrome coated (CC) reticle top. The discrete diffuser DDE, creates diffused light, DL, from incident light, IL, that evenly fills the entrance pupil of machine, MA.

Figure 18:
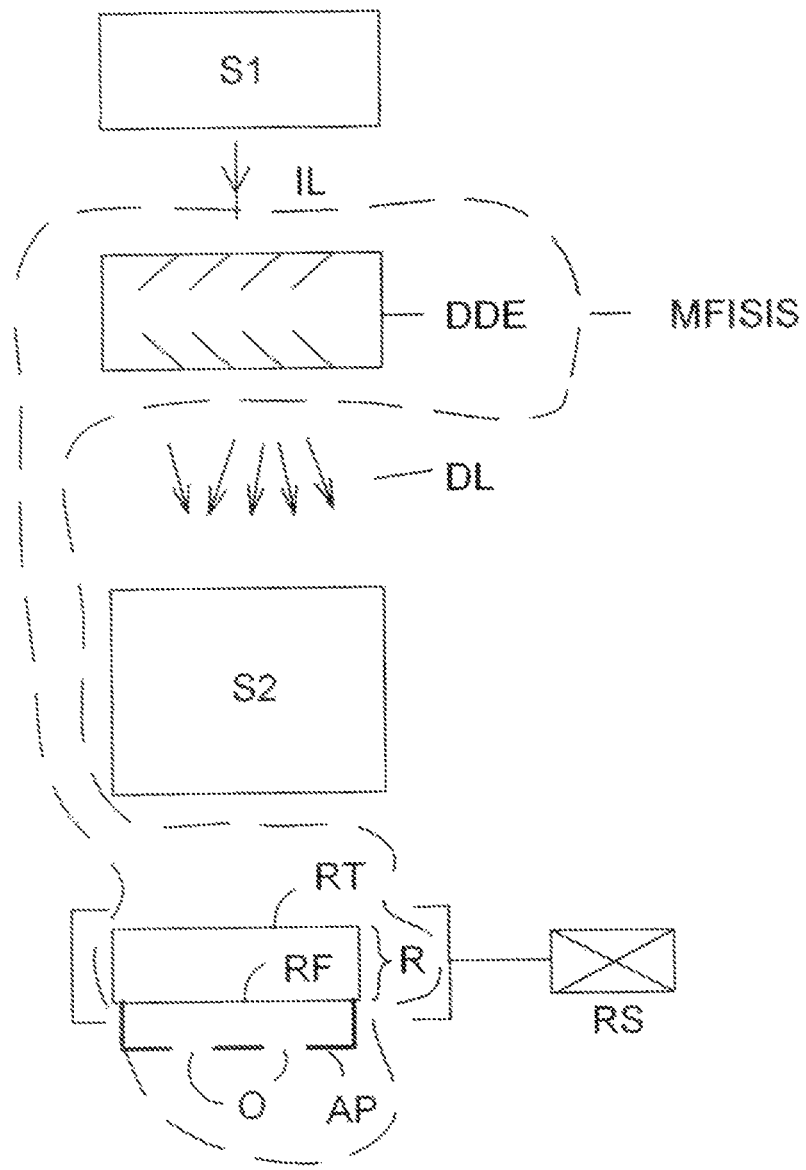
FIG. 18 is a block diagram illustrating another embodiment of a MFISIS.

FIG. 18 is a block diagram illustrating another embodiment of a MFISIS. As shown in FIG. 18, in this embodiment, second variation of the MFISIS in which the DDE is placed between sections SI and S2 of a source, and reticle stage, RS, holds reticle, R, which has aperture plate, AP, with openings, 0, attached to reticle face, RF.

Ninth Embodiment of MFISIS

Figure 19:
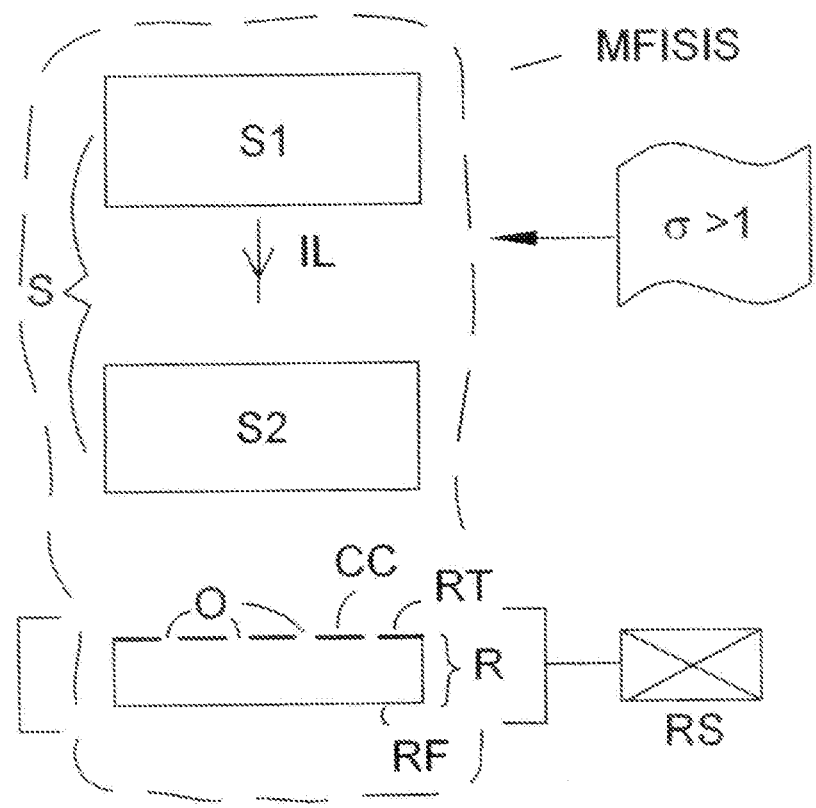
FIG. 19 is a block diagram illustrating a first variation of a ninth embodiment of a MFISIS.

FIG. 19 is a block diagram illustrating a first variation of a ninth embodiment of a MFISIS. In this embodiment, the MFISIS includes a reticle, R, with openings, 0, in reticle top, RT, that is otherwise chrome coated (CC). A source, S, is set to a diagnostic illumination condition where the angular extent of the source is set to be larger than the angular size of the entrance pupil. This is indicated as the command in the bannered box "$\sigma > 1$". This is called a diagnostic setting since the product (chips) are not run at this class of illumination conditions.

Figure 20:
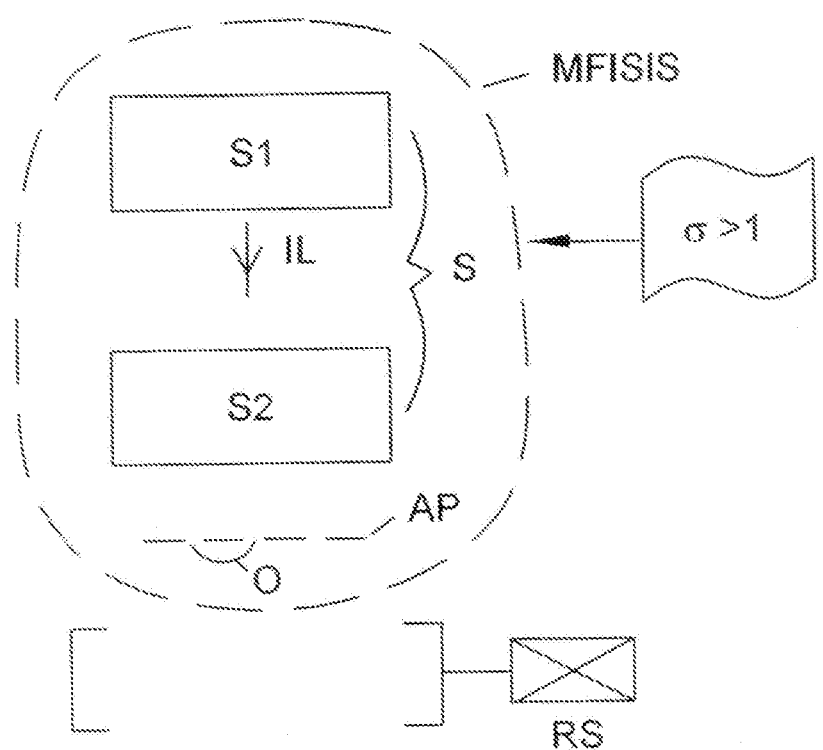
FIG. 20 is a block diagram illustrating a second variation of the ninth embodiment of a MFISIS.

FIG. 20 is a block diagram illustrating a second variation of the ninth embodiment of a MFISIS where aperture plate, AP, is placed at a discrete location between sources and reticle stage, RS. AP contains openings, O. Source, S, is run at the diagnostic setting "$\sigma > 1$", again indicated by the bannered box. This is a useful configuration in reflective systems where the only addition would be a blank, uniformly reflective (bright field) reticle placed in reticle stage, RS.

Figure 21:
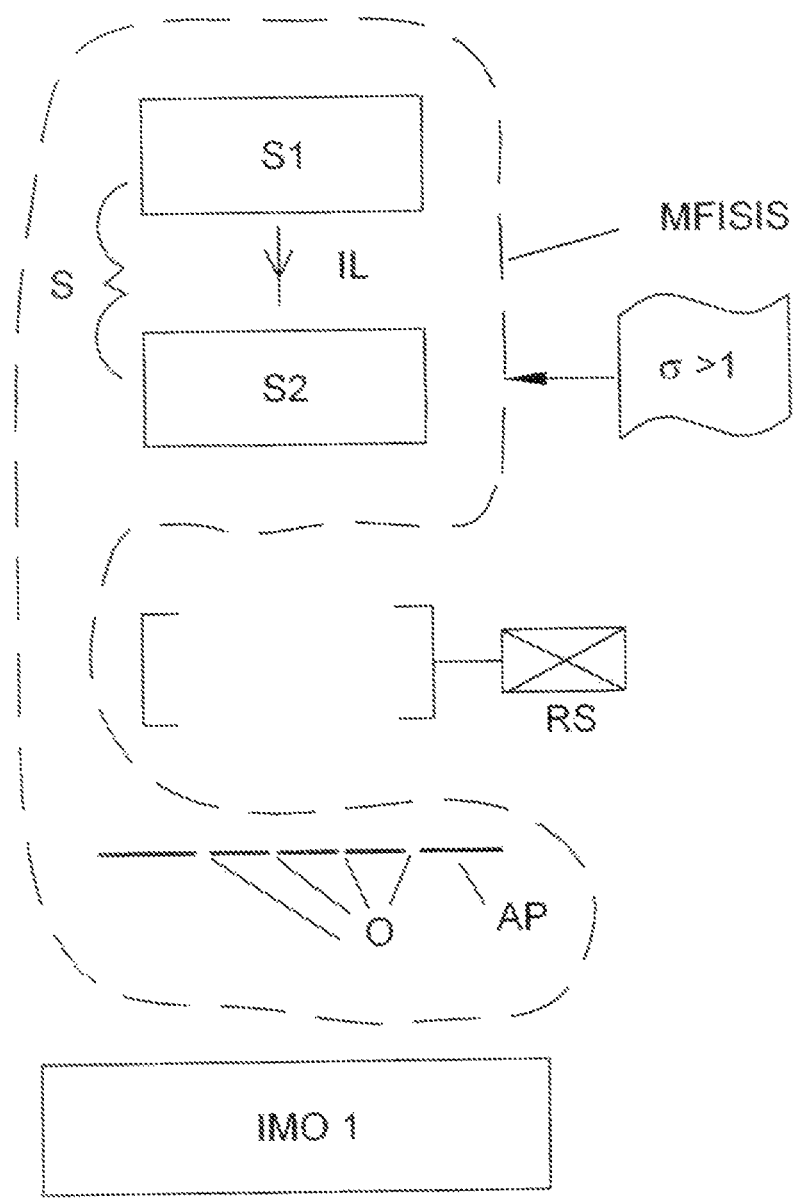
FIG. 21 is a block diagram illustrating a third variation of the ninth embodiment of a MFISIS.

FIG. 21 is a block diagram illustrating a third variation of the ninth embodiment of a MFISIS. In this variation, the aperture plate, AP, containing openings, 0, is placed between reticle stage, RS, and the first portion of imaging objective IMO1. Source, S, is run at "$\sigma > 1$" diagnostic mode. This configuration can be used in reflective systems where the only addition would be a blank, uniformly reflective (bright field) reticle placed in reticle stage, RS. One method for achieving this is to mechanically scan or nutate a smaller ($\sigma < 1$) source in angle during the course of an exposure or as a sequence of sub-exposures at different angles.

10th Embodiment

Figure 22:
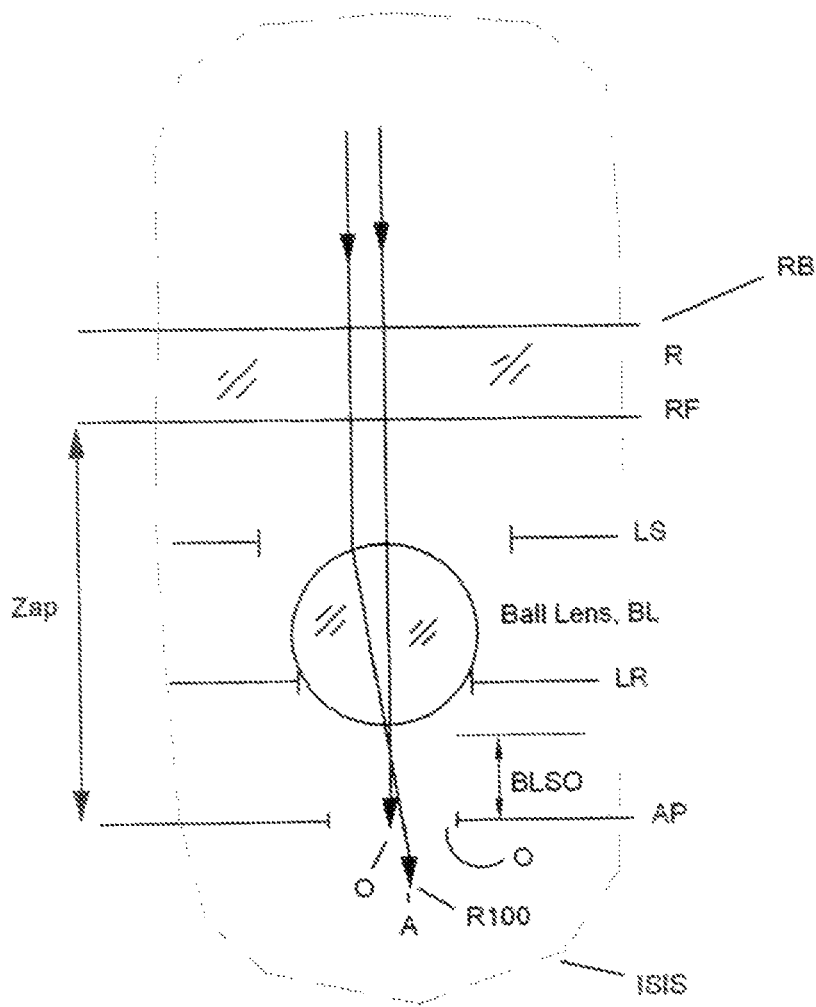
FIG. 22 is a schematic diagram illustrating a cross-section on an ISIS in a $10^{th}$ embodiment.

FIG. 22 is a schematic diagram illustrating a cross-section on an ISIS in a 10th embodiment. As shown in FIG. 22, a ball lens, BL, is located below reticle face, RF, approximately focuses onto opening, 0, in aperture plate, AP. An advantage of this arrangement is that because of short focal length of ball lens, BL, compared to aperture plate standoff (zap), there is a large source grasp. One example using the following constructional parameters—

| | |
|---|---|
| Wavelength = | 248 mm |
| ball lens diameter = | 1 mm |
| ball lens material = | UV grade fused silica |
| pinhole diameter in aperture plate (diameter of 0) = | 0.155 mm |
| zap = | 4.923 mm |
| ball lens standoff from aperture plate (BLSO in FIG. 22) = | 0.192 mm | has a source grasp (i.e. region in solid angle space with transmission=1) numerical aperture (NA)>0.1 on the reticle side. This means a source with smaller NA will be completely passed by this ISIS resulting in uniform and bright illumination of the machine exit pupil. Resolution of this device corresponds to an NA on the wafer side of NAres~0.063.

For use with an electronic sensor, this high brightness helps reduce noise and exposure time however if photoresist coated wafers are utilized as the recording means then we could reduce the transmission of ISIS by one of a number of means. One mechanism involves coating reticle back, RB, with a partially reflecting or partially absorbing coating (>~90-98% attenuation). Another mechanism involves utilizing attenuated phase shift mask material (~6% transmission) on reticle face, RF.

To increase the resolution (decrease NAres above) we merely reduce diameter of 0, however this results in a smaller source grasp. This can be compensated for by running light source S at a smaller coherence or sigma value (this decreases NAs) or by including grating structures on reticle face, RF, or reticle back, RB (vide supra).

11th Embodiment

Figure 23:
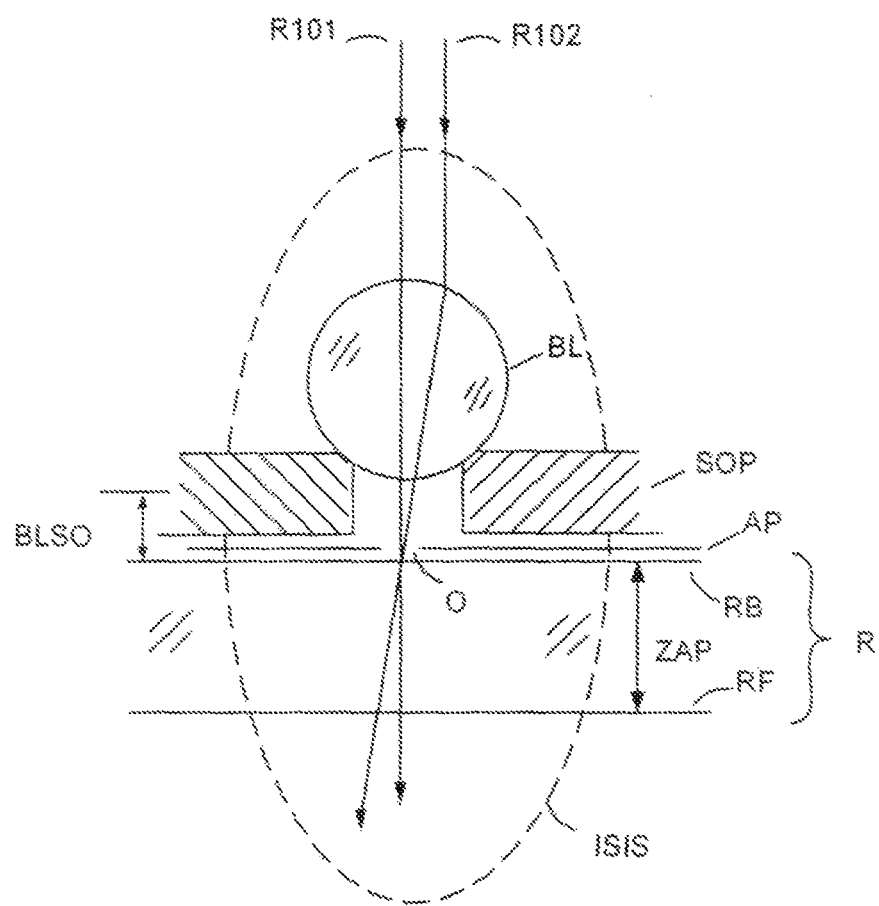
FIG. 23 is a schematic diagram illustrating a cross section on an ISIS in an $11^{th}$ embodiment.

FIG. 23 is a schematic diagram illustrating a cross section on an ISIS in an 11'h embodiment. In this embodiment, the ball lens, BL, is located above reticle back, RB, approximately focuses onto opening, 0, in aperture plate, AP (also on RB). Aperture plate standoff (zap) is now the distance from RF to AP. One example uses the following constructional parameters—

| | |
|---|---|
| Wavelength = | 248 nm |
| ball lens diameter = | 1.8 mm |
| ball lens material = | UV grade fused silica |
| pinhole diameter in aperture plate (diameter of 0) = | 0.155 mm |
| zap = | 4.923 mm |
| ball lens standoff from aperture plate (BLSO in FIG. 23) = | 0.400 mm. |

Again for use with an electronic sensor, high brightness helps reduce noise and exposure time however if photoresist coated wafers are utilized as the recording means then we could reduce the transmission of ISIS, as discussed in relation to FIG. 22.

Again, to increase the resolution, reduce diameter of 0 resulting in a smaller source grasp. Again, this can be compensated for by running the light source S at a smaller coherence or sigma value (this decreases NAs) or by including grating structures on the reticle face, RF, or reticle back, RB, as discussed in relation to FIG. 22.

In the examples illustrated in FIGS. 22 and 23, a ball lens was used. It should be appreciated that any other type of lens may be used. Likewise, the examples in FIGS. 22 and 23 illustrate a reticle, but it should be appreciated that a grating could also be used.

Additional Embodiments

High NA lithography: The methods for the preferred embodiment can be used for lithographic systems operating with effective numerical apertures >1 (immersion or other lithography). For such cases, it is necessary to correct the transmission function (Equation 1) by adjusting the direction cosine on the wafer side by the index of refraction of the coupling material and reticle-side direction cosine. For example, using water as the immersion fluid, $$\bar{n}r = \frac{ni}{M} * \bar{n}w$$

where; $\bar{n}r$=the direction cosine of a ray on the reticle side, $\bar{n}w$=the geometric direction cosine on the wafer side, ni=index of refraction of the immersion fluid at the exposure wavelength (ni~1.44 for water at 193 nm), and M is the system reduction magnification. Using $\bar{n}w$ for $\bar{n}x$ and $\bar{n}y$ in Equation 1 we-can express this as:

$$T(\bar{n}w) = \frac{dI}{do}(\bar{n}w) * \sqrt{\frac{1(nw)^2}{1-(ni/M)^2*(nw^2)}}$$ (Equation 10)

Hence, we would have to observe the energy distribution in the immersion media using a suitable recording media presented below. Note, Equation 2 shows the general relationship for any media.

Process for Measuring T (nx, ny), First Embodiment

Figure 24:
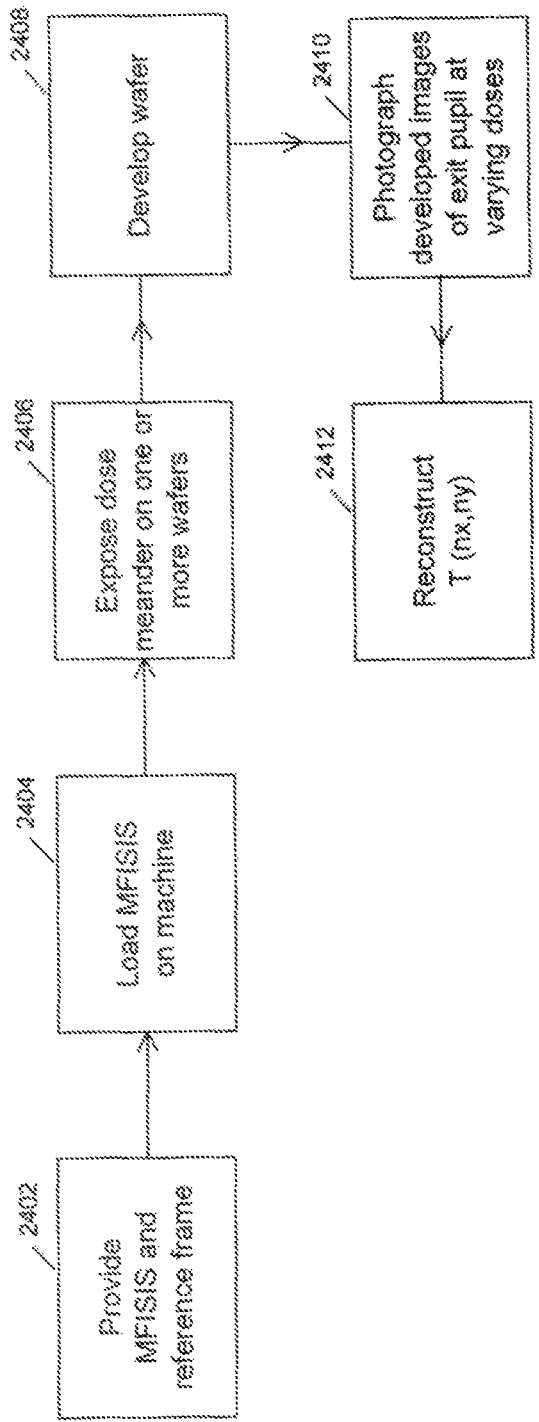
FIG. 24 is a flow diagram illustrating an embodiment for measuring the exit pupil transmission using silicon wafers coated with a suitable recording media.

FIG. 24 is a flow diagram illustrating an embodiment for measuring the exit pupil transmission using silicon wafers coated with a suitable recording media. For example, when recording the source images in photoresist on a wafer, the process flow of FIG. 24 may be used. Flow begins in block 2402 where an MFISIS, as described herein, is provided and loaded onto the machine. Flow continues to block 2404 where a resist-coated substrate (wafer) is provided and loaded on the machine. Then, in block 2406, the substrate is exposed at multiple, increasing exposure doses at discretely separated image fields on a wafer (or additional wafers). See, for example, page 3 of "Examples of Illumination Source Effects on Imaging Performance" by A. J. de Ruyter et al., in ARCH Chemicals Microlithography Symposium, pp. 1-8, 2003. Flow continues to block 2408 and the substrate is then developed. Then in block 2410 the exposed images are photographed (multiple photographs for each field point) one by one (dose by dose). From these images and knowledge of the exposure dose sequence, the "raw" intensity contours of $$\frac{dI}{do}(\bar{n}x, \bar{n}y)$$

are obtained. Then in block 2414, these intensity contours are computationally overlapped to reconstruct the normalized radiant intensity as a function of nx and ny for all field points yielding $T(\bar{n}x,\bar{n}y)$ to within a constant, multiplicative factor:

$$T(nx, ny) = \sqrt{\frac{1-n_x^2-n_y^2}{1-n_x^2/M^2-n_y^2/M^2}} \frac{dI}{do}(nx, ny)$$ (Equation 11)

The logarithm of this result can be expanded in a Zernike polynomial basis functions (FIG. 25). We can further deconvolve the result of Equation 11 to take out the effects of possible pinhole averaging.

Process for Measuring T (nx, ny), Second Embodiment

Figure 26:
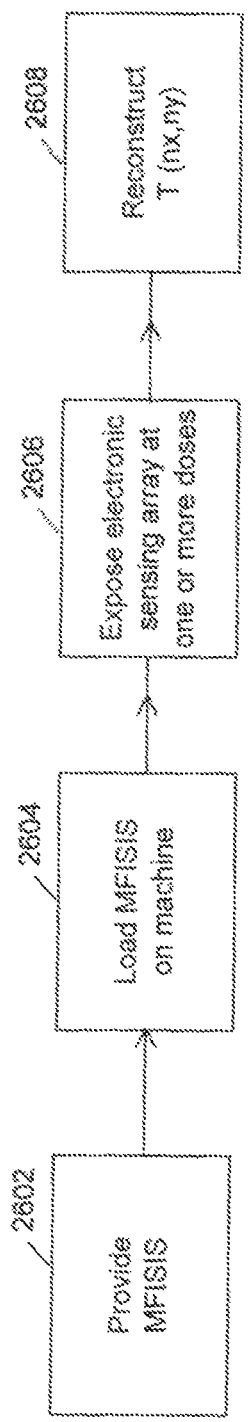
FIG. 26 is a flow chart illustrating an embodiment for measuring the exit pupil transmission using an electronic sensor.

FIG. 26 is a flow chart illustrating an embodiment for measuring the exit pupil transmission using an electronic sensor. For example, if images are recorded electronically (e.g., on a CCD array) instead of in photoresist, the steps outlined in FIG. 26 may be followed. A difference between this and the previous method, shown in FIG. 24, is that recorded sensor output directly provides the "raw" intensity or signal for the radiant intensity. If necessary, gain offsets or appropriate mappings can be used to correct the raw intensity signals and arrive at a final normalized radiant intensity (see Equation 10). In addition, for immersion systems operating at a similar dry NA (NAwet=NAdry), the depth of focus requirements for the electronic recording device are also considered. Deconvolution of pinhole effects can then proceed as in the first embodiment.

Flow begins in block 2602 where an MFISIS is provided. Flow continues to block 2604 and the MFISIS is loaded onto the machine. Then in block 2606 an electronic sensing array is exposed at one or more doses. Flow then continues to block 2608 and $T(\bar{n}x,\bar{n}y)$ is reconstructed.

Process for Amelioration of Transmission Error

Several methods for the amelioration of transmission related errors uniquely associated with the photolithographic exposure tool using the transmission function $T(nx,ny,x,y)$ as determined by the apparatus and method of measurement for the preferred embodiment are now discussed.

Numerical Aperture Error Adjustment

First, for each field point (i) extract the numerical aperture $(NA_i)$ from the effective $T(nx,ny)_i$; map by determining the sine of the maximum half angle as a function of theta (angular extent of the pupil). This then yields the effective NA for each field point. Next, calculate the average NA (NAavg) for the system by simply summing over the total number of field points (N): or, $NAavg=\Sigma NA_i/N$. To the extent this differs from the nominal or desired NA setting, the physical blades at the appropriate aperture stop (AS, FIG. 1) can be adjusted to the desired setting.

Numerical Aperture Error Adjustment (Elliptical Systems)

A method for the amelioration of the exit pupil numerical aperture error for elliptically adjustable photolithographic exposure systems (elliptical NA systems) comprising the following steps: Step 1, using the methods of this invention for determining $T(nx,ny)$ as a function of field position, determine the x and y components of the NA (NAx, NAy) for each field point—using an averaging process for each component. Step 2, determine the largest eccentricity in NA for all field points measured (or interpolated) using $\Delta NA=max|NAx-NAy|$. Step 3, if $\Delta NA>$process tolerance (known or determined by simulation) make machine adjustments to correct the problem (e.g., adjust elliptical NA system parameters).

Numerical Aperture Misalignment

A method for the correcting aperture misalignment comprising the following steps: Step 1, calculate the average error using the following equation and the known transmission function:

$$<nc_i>=\int n * T(\bar{n}) * do_n / \int T(\bar{n}) do_n \qquad \text{(Equation 12)}$$

Where: $do_n=d^2n/\sqrt{1-n^2}$, is the solid-angle, n is the direction cosine, and $<nc_i>$ represents the average direction cosine of each field point, whose ideal value is zero. Step 2, determine $<nc>$ (the average aperture offset for all field points) using:

$$\langle nc \rangle = \sum_1 \langle nc_i \rangle / N.$$

Step 3, correct for this overall aperture offset by shifting the appropriate stop to make $<nc>$=zero.

Sampling: Since we expect lens transmission to change over time (see "Impact of Across Pupil Transmittance Variation in Projection Lenses on Fine Device Pattern Imaging", supra), in-situ transmission measurements can be made at appropriate time intervals—logging or recording transmission maps as a function of time can be used to help identify root cause and provide for an appropriate amelioration schedule.

Gray Level Correction

A method for amelioration of transmission errors across the exposure field comprising the following steps: Step 1, determine the transmission characteristics for the photolithographic exposure system as described in the preferred embodiment. Step 2, calculate $Tavg(n)=\Sigma T(n)_i/N$—the average value of the transmission for each field point as a function of direction cosine. Step 3, configure a gray-level pupil filter to average out the high levels of transmission in the pupil plane—for those photolithographic systems with accessible pupils. Note: $Tavg(n)<1$, and the filter is adjusted spatially to reduce the higher intensity areas to the normalized background intensity.

Variations of the Main Embodiments

A number of variations of the embodiments described above are possible.

In all of the MFISIO designs, image distortion is not a significant design constraint since to the extent it is known (vis a vis its design value) it can be compensated for, as will be known to those skilled in the art.

Figure 27:
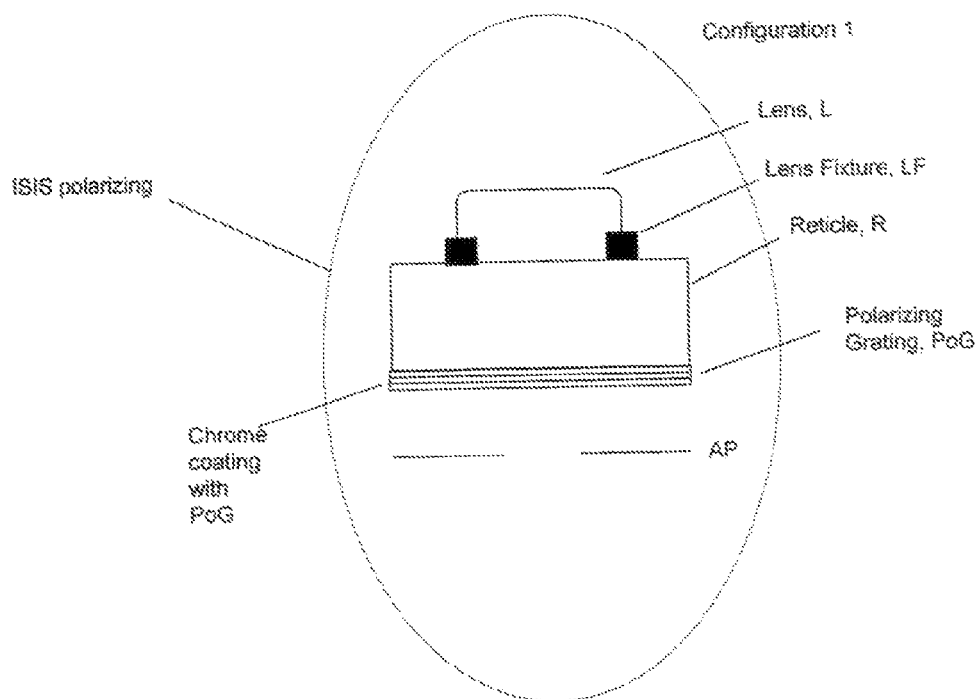
FIG. 27 is a block diagram of an embodiment of an ISIS that includes a sub-resolution grating.
Figure 28:
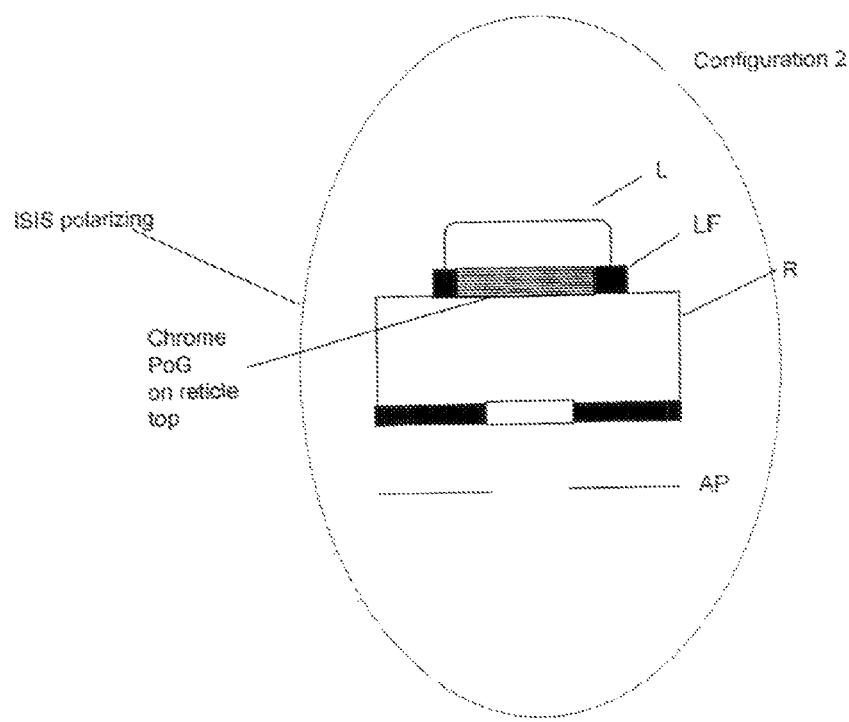
FIG. 28 is a block diagram of another embodiment of an ISIS that includes a sub-resolution grating.

Polarization:

The apparatus and method for the preferred embodiment can be configured to measure transmission sensitivity to polarization by using an unpolarized light source or a source with an adjustable polarization. For the case of an unpolarized source, the illumination optics or reticle (for the preferred embodiment) can be adjusted (possibly in combination) in such a way as to deliver polarized light (given by the proper Jones vector) to the wafer plane. Changes to the illumination system include combinations of polarizers, filters, and possibly sub-resolution gratings (see E. Hecht, "Optics", *Addison Wesley,* 2nd Edition, 1987, pp. 279, 497). Changes to the reticle for the preferred embodiment include adding sub-resolution gratings to the ISIS structure (two possible configurations are shown in FIGS. 27 and 28) on any one of the following surfaces or materials: plano convex lens top, bottom, reticle top or bottom, pinhole opening. In addition, polarizing filters can be used and added in a similar manner, or the pinhole shape can take the form of a slit with a direction perpendicular to the desired polarization state. In addition, variations to the ISIS structures shown in FIGS. 4, 11, 12, 14, 15 and 16 are also possible using the same techniques with regard to configuration design and polarization. For light sources with adjustable polarization, the reticle can be adjusted as described above, however, since it is possible that illumination optics can change polarization, measurements should be made to determine the polarization state of the light hitting the ISIS structure. This way, the ISIS structures can accommodate such changes. The information obtained, namely, differences in transmission for different polarization states can be used to study (simulate) polarization induced contrast loss—a function of direction cosine at the wafer plane.

Figure 29:
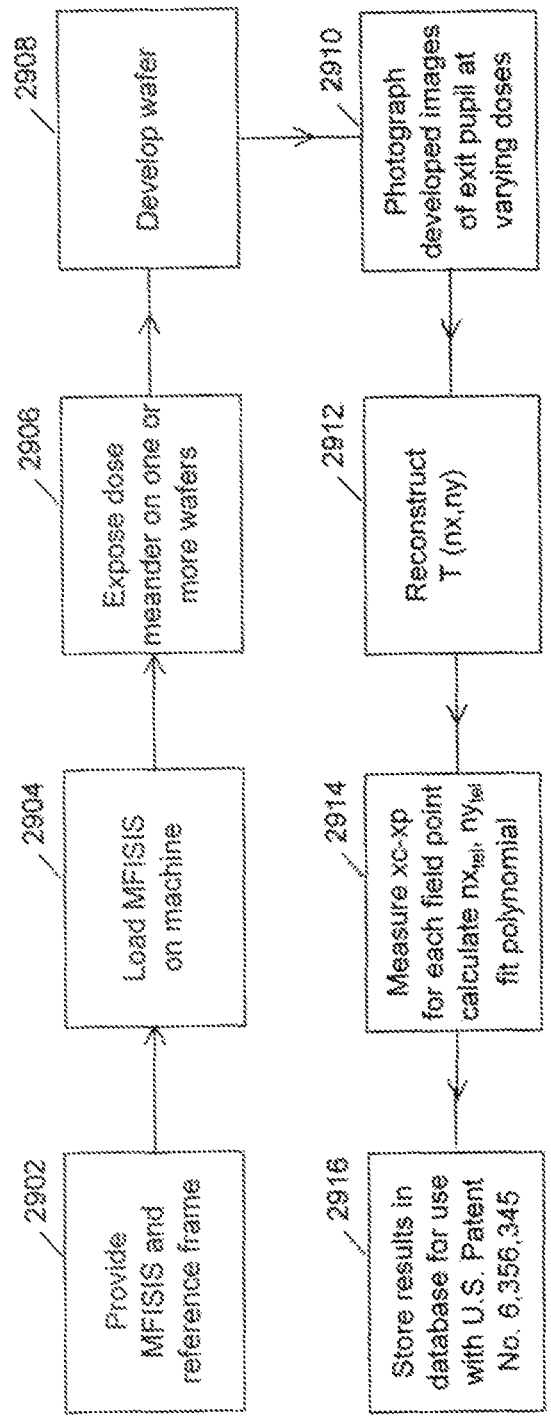
FIG. 29 is a flow diagram illustrating an embodiment for the determination of reticle side telecentricity (RSTC) as a function of field position.

Reticle Side Telecentricity:

An apparatus and process for the determination of reticle side telecentricity (RSTC) as a function of field position is shown in FIG. 29. FIG. 29 is a flow diagram illustrating an embodiment for the determination of reticle side telecentricity (RSTC) as a function of field position. Flow begins in block 2902 where an MFISIS and reference frame are provided. Then in block 2904 the MFISIS is loaded onto the machine. Then in block 2906 an expose dose is meander on one or more wafers. Then in block 2908 the wafer is developed. In block 2910 the developed images of the exit pupil at varying doses are photographed. Flow continues to block 2912 and $T(\bar{n}x,\bar{n}y)$ is reconstructed.

Then in block 2914, the method includes measuring the distance between the center of the image frame and the center of exit pupil (as printed in resist)—as a function of field position, calculating the individual RSTC components using;

$$nx_{TEL} = \left(\frac{x_p - x_c}{Z_{ap}}\right) * M \text{ and } ny_{TEL} = \left(\frac{y_p - y_c}{Z_{ap}}\right) * M:$$

where xp, yp and xc, yc are positions at the wafer for a given field point and are scaled by the system magnification and aperture plate distance (FIG. 3), and storing the results in a database. The functional dependence of RSTC components can be expressed (fit-to) in terms of a radial polynomial such as (ao+a1*r+a2*$r^2$). Then in block 2916, these values may be entered into a database for use, for example, with the methods described in "In-Situ Source Metrology Instrument and Method of Use", supra—where the effects of RSTC need to be accounted for.

The present invention has been described above in terms of presently preferred embodiments so that an understanding of the present invention can be conveyed. There are, however, many configurations for determining exit pupil transmittance not specifically described herein but with which the present invention is applicable. The present invention should therefore riot be seen as limited to the particular embodiments described herein, but rather, it should be understood that the present invention has wide applicability with respect to image projection systems. All modifications, variations, or equivalent arrangements and implementations that are within the scope of the attached claims should therefore be considered within the scope of the invention.

The invention claimed is:

1. A light conditioner comprising:
   a reticle having a reticle top surface and a reticle bottom surface;
   a lens and means for mounting the lens to the reticle; and
   an aperture plate and means for mounting the aperture plate to the reticle, wherein the lens is mounted above the reticle top surface and substantially focuses on the aperture plate, the aperture plate being attached to the reticle top surface.

2. The light conditioner as defined in claim 1, wherein the lens is a ball lens.

3. A light conditioner comprising:
   a reticle having a reticle top surface and a reticle bottom surface;
   a lens and means for mounting the lens to the reticle; and
   an aperture plate and means for mounting the aperture plate to the reticle, wherein the lens is mounted below the reticle bottom surface and substantially focuses on the aperture plate, the aperture plate being attached to the reticle bottom surface.

4. A light conditioner as defined in claim 3, wherein said lens is a ball lens.

5. A method of determining a reticle side telecentricity of a projection imaging system, the method comprising:
   providing an illumination source with a substantially uniform illumination with an angular extent that is greater than an angular size of an entrance pupil of the projection imaging system;
   exposing a recording media with illumination from the illumination source that is emitted from an exit pupil of the projection imaging system;
   reconstructing a transmission function of the projection imaging system as a function of field position from the exposed recording media;
   determining a difference between a center of a reference frame and a center of the exposed exit pupil for each of a plurality of field points in the exit pupil; and
   calculating individual components of reticle side telecentricity.

6. A method as defined in claim 5, further comprising fitting the components to a polynomial function.

7. A method as defined in claim 5, wherein the projection imaging system comprises a stepper, a scanner, a scanner configured for immersion lithography, or a stepper configured for immersion lithography.

8. A method as defined in claim 5, wherein the recording media comprises a photoresist, an electronic device, or a CCD structure.

9. A method as defined in claim 5, wherein exposing comprises multiple sub-exposures.

10. A light conditioner for a projection imaging system, the light conditioner comprising:
    an optical input;
    an optical output, wherein the light conditioner receives light at the optical input from a light source and outputs a substantially uniform illumination light with an angular extent that is greater than an angular size of an entrance pupil of the projection imaging system;
    a reticle having a reticle top surface and a reticle bottom surface;
    a lens and means for mounting the lens to the reticle; and
    an aperture plate and means for mounting the aperture plate to the reticle, wherein the lens is mounted above the reticle top surface and substantially focuses on the aperture plate, the aperture plate being attached to the reticle top surface.

11. The light conditioner as defined in claim 10, wherein the lens is a ball lens.

12. A light conditioner for a projection imaging system, the light conditioner comprising:
    an optical input;
    an optical output, wherein the light conditioner receives light at the optical input from a light source and outputs a substantially uniform illumination light with an angular extent that is greater than an angular size of an entrance pupil of the projection imaging system;
    a reticle having a reticle top surface and a reticle bottom surface;
    a lens and means for mounting the lens to the reticle; and
    an aperture plate and means for mounting the aperture plate to the reticle, wherein the lens is mounted below the reticle bottom surface and substantially focuses on the aperture plate, the aperture plate being attached to the reticle bottom surface.

13. The light conditioner of claim 12, wherein said lens is a ball lens.

* * * * *